United States Patent
Sugai et al.

(10) Patent No.: US 12,244,325 B2
(45) Date of Patent: Mar. 4, 2025

(54) INFORMATION PROCESSING DEVICE, ENCODING METHOD, AND DECODING METHOD

(71) Applicant: Sony Group Corporation, Tokyo (JP)

(72) Inventors: Ren Sugai, Tokyo (JP); Hiroki Matsuda, Tokyo (JP); Ryota Kimura, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 58 days.

(21) Appl. No.: 18/040,818

(22) PCT Filed: Aug. 12, 2021

(86) PCT No.: PCT/JP2021/029736
§ 371 (c)(1),
(2) Date: Feb. 7, 2023

(87) PCT Pub. No.: WO2022/050020
PCT Pub. Date: Mar. 10, 2022

(65) Prior Publication Data
US 2023/0283301 A1 Sep. 7, 2023

(30) Foreign Application Priority Data

Sep. 2, 2020 (JP) .................................. 2020-147864

(51) Int. Cl.
*H03M 13/37* (2006.01)
*H03M 13/29* (2006.01)

(52) U.S. Cl.
CPC ..... *H03M 13/373* (2013.01); *H03M 13/2957* (2013.01)

(58) Field of Classification Search
CPC ... H04L 1/0041; H04L 1/0057; H04L 1/0058; H04L 1/0061; H04L 1/0065; H04L 1/08; H04L 1/1819
See application file for complete search history.

(56) References Cited

U.S. PATENT DOCUMENTS 7,924,761 B1 * 4/2011 Stevens ............. H03M 13/3761
370/473
2011/0161771 A1 6/2011 Zheng
(Continued)

FOREIGN PATENT DOCUMENTS

EP 2385644 A1 11/2011
JP 2013-521695 A 6/2013
(Continued)

OTHER PUBLICATIONS

Xiao et al., Cross-layer designed of rateless random network codes for delay optimization, IEEE Trans. on Comm. vol. 59, No. 12, pp. 3311 to 3322. (Year: 2011).*
(Continued)

*Primary Examiner* — Shelly A Chase
(74) *Attorney, Agent, or Firm* — XSENSUS LLP

(57) ABSTRACT

Provided are an information processing device, an encoding method, and a decoding method that implement low latency communication. An information processing device of the present disclosure includes a first processing unit that performs processing of a first protocol layer including processing of generating first coded data by encoding first data with an erasure correction code that is a first code, and provides the first coded data to a second protocol layer lower than the first protocol layer.

22 Claims, 30 Drawing Sheets

(56) References Cited

U.S. PATENT DOCUMENTS

2016/0294512 A1   10/2016  Noh et al.
2018/0212714 A1    7/2018  Mori
2019/0357196 A1*  11/2019  Majmundar ........ H04L 49/3072

FOREIGN PATENT DOCUMENTS

| JP | 2016-163139 A | 9/2016 | |
| WO | WO-2005020607 A2 | 3/2005 | |
| WO | 2010/087197 A1 | 8/2010 | |
| WO | WO-2016022982 A1 * | 2/2016 | .......... H03M 13/154 |
| WO | 2017/026198 A1 | 2/2017 | |

OTHER PUBLICATIONS

Naderi et al., Error control for multimedia communications in wireless sensor networks: a comparative performance analysis, Elsevier, Ad Hoc Networks, pp. 1028 to 1042 (Year: 2011).*
International Search Report and Written Opinion mailed on Oct. 26, 2021, received for PCT Application PCT/JP2021/029736, filed on Aug. 12, 2021, 9 pages including English Translation.
3GPP, "NR; Multiplexing and channel coding (Release 15)", 3GPP TS 38.212 V15.7.0, Sep. 2019, pp. 1-101.

* cited by examiner

INFORMATION PROCESSING DEVICE, ENCODING METHOD, AND DECODING METHOD

CROSS-REFERENCE TO RELATED APPLICATIONS

The present application is based on PCT filing PCT/JP2021/029736, filed Aug. 12, 2021, which claims priority to Japanese Application No. 2020-147864, filed Sep. 2, 2020, the entire contents of each are incorporated herein by reference.

TECHNICAL FIELD

The present disclosure relates to an information processing device, an encoding method, and a decoding method.

BACKGROUND ART

Wireless access schemes and wireless networks for cellular mobile communication (hereinafter, also referred to as "Long Term Evolution (LTE)", "LTE-Advanced (LTE-A)", "LTE-Advanced Pro (LTE-A Pro)", "Evolved Universal Terrestrial Radio Access (EUTRA)", "New Radio (NR)", "New Radio Access Technology (NRAT)", or "Further EUTRA (FEUTRA)") are under review in the 3rd Generation Partnership Project (3GPP). Note that, in the following description, LTE includes LTE-A, LTE-A Pro, and EUTRA, and NR includes NRAT and FEUTRA.

In LTE, a base station device (base station) is also referred to as an evolved NodeB (eNodeB), and in NR, a base station device (base station) is also referred to as a gNodeB. In LTE and NR, a terminal device (mobile station, mobile station device, or terminal) is also referred to as user equipment (UE).

LTE and NR are cellular communication systems in which a plurality of areas covered by base stations is arranged in cell shapes. A single base station may manage multiple cells. In the NR, in addition to an enhanced mobile broadband (eMBB) of conventional data communication of smartphones, it is assumed that one wireless system supports various communication use cases such as Ultra-Reliable and Low Latency Communication (URLLC) or the like which requires high reliability and low latency for emergency message transmission used for automated driving or the like.

In URLLC in which a low latency requirement is high, a latency caused by retransmission is one of problems. Non-Patent Document 1 discloses an error correction code related technique studied in NR.

Patent Document 1 discloses an invention in which a small block that achieves an equivalent packet error rate is added in front of a transport block (TB) or a code block (CB) as a method of reducing a decoding latency. However, the method disclosed in Patent Document 1 cannot reduce a retransmission latency that is dominant as a latency.

CITATION LIST

Patent Document

Patent Document 1: US 2016/0,294,512 A

Non-Patent Document

Non-Patent Document 1: 3GPP TS 38.212 V15.7.0 (2019-09), "Multiplexing and channel coding (Release 15)"

SUMMARY OF THE INVENTION

Problems to be Solved by the Invention

The present disclosure provides an information processing device, an encoding method, and a decoding method that implement low latency communication.

Solutions to Problems

An information processing device of the present disclosure includes a first processing unit that performs processing of a first protocol layer including processing of generating first coded data by encoding first data with an erasure correction code that is a first code, and provides the first coded data to a second protocol layer lower than the first protocol layer.

An encoding method of the present disclosure performs processing of a first protocol layer including processing of generating first coded data by encoding first data with an erasure correction code that is a first code, and provides the first coded data to a second protocol layer lower than the first protocol layer.

An information processing device of the present disclosure includes: a first processing unit that performs processing of a first protocol layer including processing of decoding data encoded by an erasure correction code that is a first code and further encoded by a second code by a decoding scheme corresponding to the second code; and a second processing unit that performs processing of a second protocol layer including processing of decoding decoded data by a decoding scheme corresponding to the first code.

A decoding method of the present disclosure performs processing of a first protocol layer including processing of decoding data encoded by an erasure correction code that is a first code and further encoded by a second code by a decoding scheme corresponding to the second code, and performs processing of a second protocol layer including processing of decoding decoded data by a decoding scheme corresponding to the first code.

MODE FOR CARRYING OUT THE INVENTION

Hereinafter, embodiments of the present disclosure will be described with reference to the drawings.

[Configuration of Communication Network]

Figure 1:
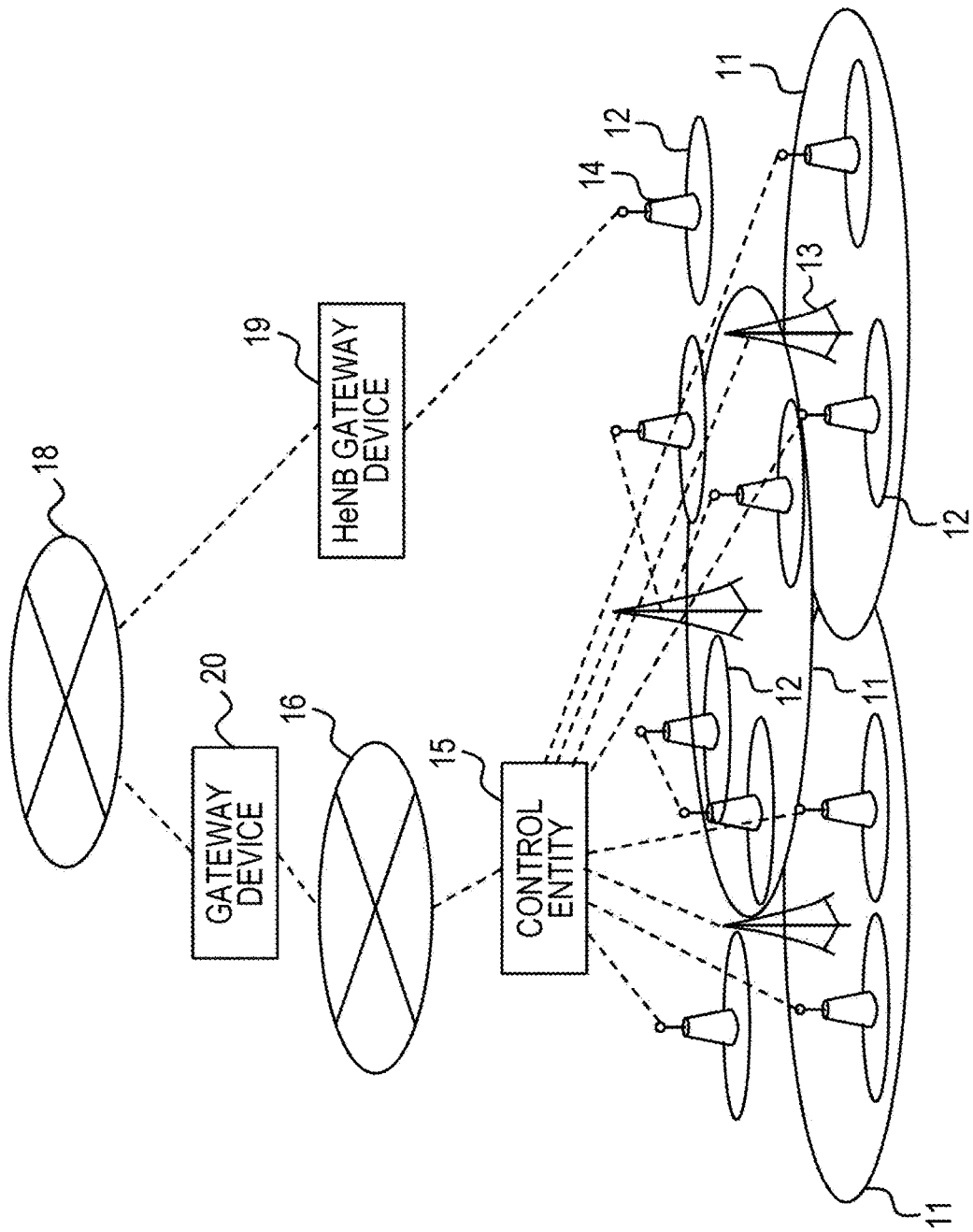
FIG. 1 is a diagram illustrating a configuration example of a communication network according to an embodiment of the present disclosure.

FIG. 1 illustrates a configuration example of a communication network according to the present embodiment. In FIG. 1, propagation channels (lines) are indicated by broken lines. A line means a logical connection, and is not necessarily directly connected physically.

As a plurality of base stations, a macro cell base station 13 that provides a macro cell 11 and a small cell base station 14 that provides a small cell 12 smaller than the macro cell are included. In a case of being referred to as a base station, the base station may be either the macro cell base station 13 or the small cell base station 14. The macro cell 11 and the small cell 12 are communication areas (cells) in which each of the plurality of base stations provides services, and are indicated by ellipses in FIG. 1. One base station may provide a plurality of cells.

The base stations can communicate with each other via a backhaul (here, wired or wireless), and mainly exchange control information. In this backhaul, for example, information may be exchanged using a protocol of the X2 interface or the S1 interface. The topology of the backhaul between the base stations may be any type such as a mesh type, a star type, a ring type, or the like.

The base station also has a backhaul with a core network. The base station may be connected to a core network 16 by being connected to a control entity 15 (the control entity 15 may be regarded as one element of the core network 16). There may be a plurality of control entities 15.

Furthermore, the base station may be connected to the core network 16 via an external network 18 in addition to via the control entity 15. Examples of such an external network 18 include a femto cell base station device, a home eNodeB (HeNB) device that can be installed indoors or at home, or the like. One or more small cell base stations 14 are connected to the external network 18 via an HeNB gateway device 19. The external network 18 is connected to the core network 16 via a gateway device 20.

The small cell 12 is basically disposed so as to overlap with the macro cell 11. However, the small cell 12 may be disposed so as to partially overlap the macro cell 11, or may be disposed completely outside the macro cell 11. A plurality of small cell base stations 14 may constitute a group (cluster). In the cluster, a base station having a role of a cluster head may be provided.

The radio resources (at least one of a frequency resource, a time resource, or a spatial resource) used in the macro cell 11 and the small cell 12 may have characteristics. For example, the same frequency resource F1 (or time resource T1) may be used by the macro cell 11 and the small cell 12. In this way, it is possible to improve the utilization efficiency of the radio resources as the entire system.

The macro cell 11 may use a frequency resource F1 (or a time resource T1), and the small cell 12 may use a frequency resource F2 (or a time resource T2). In this way, interference between the macro cell 11 and the small cell 12 can be avoided.

Further, both the frequency resources F1 and F2 (both the time resources T1 and T2) may be used by each of the macro cell 11 and the small cell 12. A method in which both the frequency resources F1 and F2 are used by each of the macro cell 11 and the small cell 12 is similar in concept to carrier aggregation (CA).

[Configuration of Transmission Device and Reception Device]

In the present embodiment, on the transmission side, a plurality of error correction codes (FEC) is used to perform stepwise encoding on an information sequence to be transmitted. Specifically, for an information sequence, encoding of a first FEC is performed first using an erasure correction code that is a first code in a first protocol layer (data link layer or the like), and encoding of a second FEC is performed second using a second code in a second protocol layer (physical layer or the like) lower than the first protocol layer. In addition, the reception side acquires an information sequence by decoding the coded data received from the transmission side in a stepwise manner by a decoding scheme corresponding to each of a plurality of FECs. Specifically, decoding of the second FEC is performed first in the second protocol layer, and decoding of the first FEC is performed second in the first protocol layer.

Figure 2:
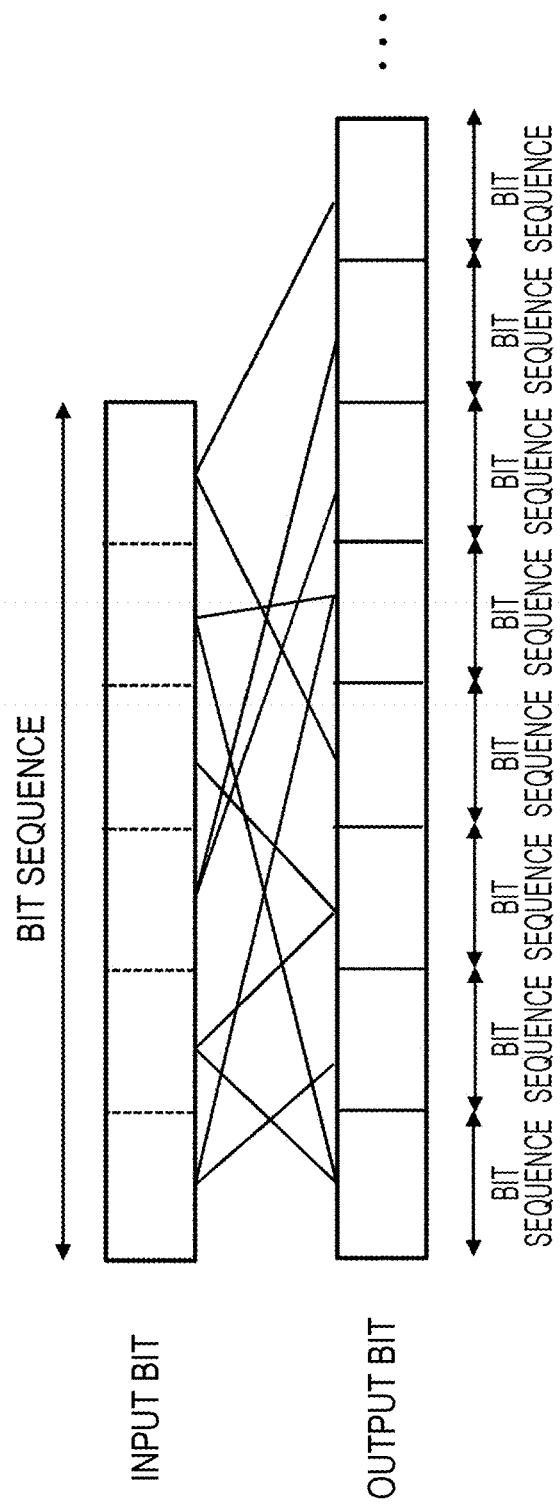
FIG. 2 is a diagram schematically illustrating encoding of a first FEC.

FIG. 2 is a diagram schematically illustrating encoding of the first FEC. In the encoding of the first FEC, one or a plurality of bit sequences to be output is generated from one input bit sequence. The plurality of generated bit sequences can be divided into two, that is, bit sequences that need to be transmitted to the reception side and bit sequences that can be decoded at the reception side without being transmitted to the reception side. That is, even if the reception side does not receive all of the plurality of bit sequences, the original bit sequence to be an input can be restored.

The bit sequence input in FIG. 2 is represented by a plurality of rectangles, and each rectangle includes one or more bits. The plurality of output bit sequences is each indicated by one rectangle, and each bit sequence corresponds to an encoded symbol including one or more bits. Each bit sequence (encoded symbol) is generated on the basis of bits corresponding to one or more rectangles on the input side. The relationship between each bit sequence and the bit on the input side from which each bit sequence is generated is represented by a straight line connecting the rectangle on the input side and the rectangle on the output side.

As the code (first code) used for the first FEC, an erasure correction code (erasure code) can be used. Examples of the erasure correction code include an FEC method belonging to a category such as rateless codes, fountain codes, or the like, or an FEC method of performing linear synthesis or XOR synthesis on a plurality of bit sequences to encode the bit sequences. Specific examples of the erasure correction code include rateless codes, fountain codes, Tornado codes, Luby Transform (LT) codes, Raptor codes, RaptorQ codes, LDPC codes, BCH codes, RS codes, Zigzag decodable codes, ZD fountain codes, XOR codes, or the like.

Figure 3:
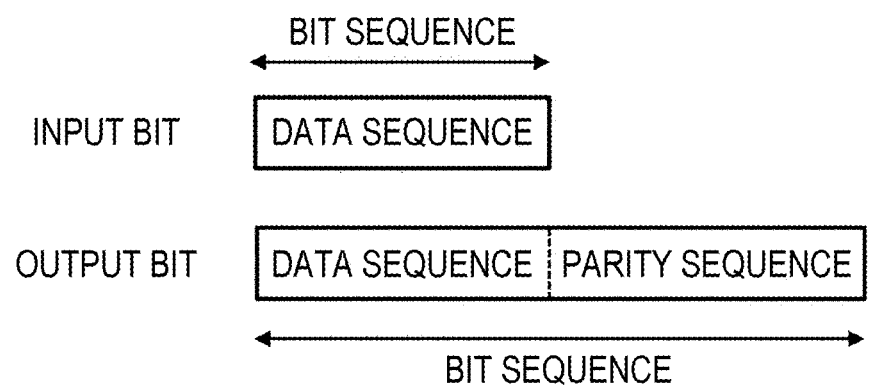
FIG. 3 is a diagram schematically illustrating encoding of a second FEC.

FIG. 3 is a diagram schematically illustrating encoding of the second FEC. In the encoding of the second FEC, one bit sequence to be output is generated from one input bit sequence. In the example of FIG. 3, the output bit string is generated by adding a parity sequence to the input bit sequence.

Example of the code (second code) used for the second FEC include convolutional codes, turbo codes, low density parity check codes (LDPC codes), polar codes, and the like. However, the use of the erasure correction code as the code used for the second FEC is not excluded.

Figure 4:
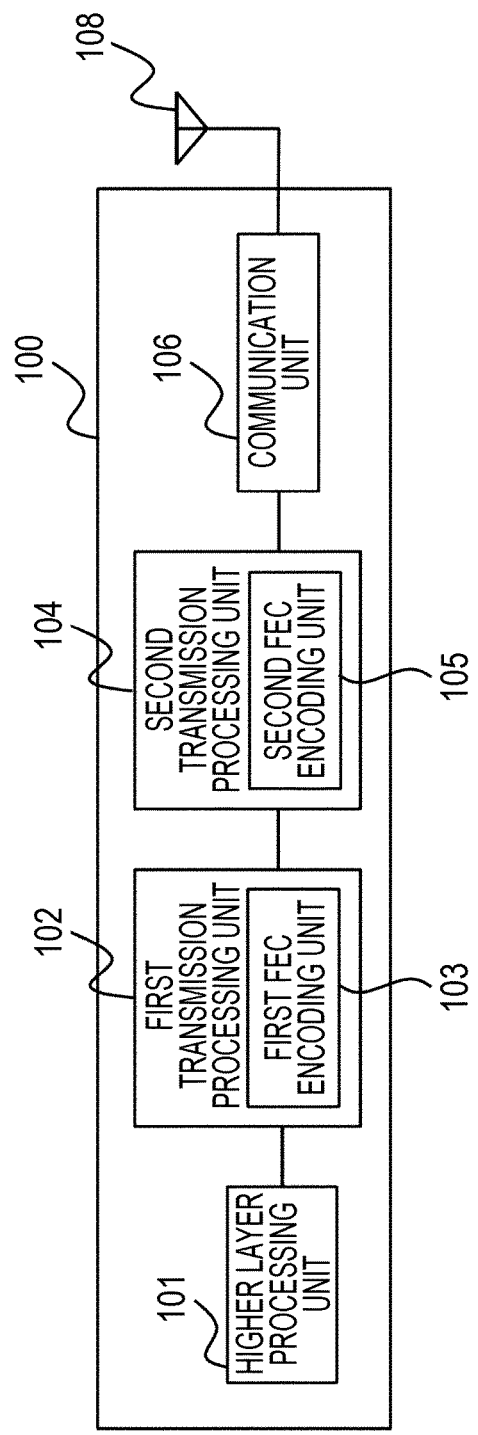
FIG. 4 is a block diagram schematically illustrating an example of a transmission device which is an information processing device according to the present embodiment.

FIG. 4 is a block diagram schematically illustrating an example of a transmission device 100 which is an information processing device according to the present embodiment. The transmission device 100 includes a higher layer processing unit 101, a first transmission processing unit 102 (first processing unit), a second transmission processing unit 104 (second processing unit), a communication unit 106, and an antenna 108. In the present embodiment, the transmission device 100 performs wireless communication, but a configuration for performing wired communication is also not excluded. In this case, the antenna 108 may not be provided.

The higher layer processing unit 101 performs processing related to a higher layer. As an example, the higher layer includes an application layer, a session layer, a presentation layer, a transport layer, and a network layer. The higher layer processing unit 101 executes an application, for example, and generates data to be transmitted to the reception device. The higher layer processing unit 101 provides the generated data to the first transmission processing unit 102. The higher layer processing unit 101 may provide additional information such as quality of service (QoS) information or the like to the first transmission processing unit 102 together with data. The quality of service information includes information such as, for example, an allowed transmission latency, transmission bandwidth, a priority of data, an application type, or the like.

The first transmission processing unit 102 performs processing related to the first protocol layer. As an example, the first protocol layer is a data link layer. Note that a part of processing of the data link layer may be performed by the higher layer processing unit 101. Alternatively, a part of processing of the higher layer may be performed by the first transmission processing unit 102. The first transmission processing unit 102 acquires the data provided from the higher layer processing unit 101 as the input bit sequence (information sequence to be transmitted and received) described in FIG. 2. The first transmission processing unit 102 includes a first FEC encoding unit 103 that performs encoding of the first FEC.

The first FEC encoding unit 103 generates first coded data by encoding data (target data) input from the higher layer processing unit 101 with an erasure correction code that is a first code. The first coded data is provided to the second transmission processing unit 104 that performs processing of the second protocol layer lower than the first protocol layer.

As an example, the first FEC encoding unit 103 divides the input data (target data) into a plurality of symbols (a plurality of pieces of first data) in encoding symbol units (first FEC symbol units), that is, in an encoding symbol size (first FEC symbol size). A plurality of coded data (encoded symbols) is generated by encoding a plurality of symbols with an erasure correction code. Error detection information is added to a plurality of pieces of coded data to obtain a plurality of pieces of first coded data (encoded symbols). Examples of the error detection information include cyclic redundancy check (CRC, hereinafter CRC), syndrome, frame check sequence (FCS), and the like. The first transmission processing unit 102 provides the plurality of pieces of first coded data to the second transmission processing unit 104. Alternatively, the first transmission processing unit 102 generates data in the format of the first protocol layer on the basis of the plurality of pieces of first coded data, and provides the generated data to the second transmission processing unit 104.

As an example, in the case of the 3GPP standard, when the first coded data matches the length to which the encoding of the second FEC is applied, a plurality of pieces of first coded data may be provided as it is as data for generating a code block. In a case where the first coded data is longer than the length to which the encoding of the second FEC is applied, the first coded data may be divided into two or more fragments, and each fragment may be provided as data for code block generation. In a case where the first coded data is shorter than the length to which the encoding of the second FEC is applied, fragments may be concatenated between different pieces of first coded data, and the concatenated fragments may be provided as data for code block generation. Division and concatenation may be combined. The operation of the first transmission processing unit 102 in the case of the 3GPP standard will be described later in detail using a specific example.

As another example, in the case of the IEEE 802.11 standard, one or a plurality of medium access control (MAC) frames may be generated on the basis of a plurality of pieces of the first coded data, and the MAC frames may be provided to the second transmission processing unit 104. The MAC frame may be a MAC protocol data unit (MPDU) or an aggregated MPDU (A-MPDU). As an example, the MAC frame includes a MAC header, a frame body field, and an FCS. The body data is stored in the frame body field. The main body data is generated on the basis of the first coded data. The first coded data included in the MAC frame may be one or more. The first coded data may be divided into two or more fragments to generate a MAC frame including fragments. A MAC frame including two or more pieces of first coded data may be generated. The main body data of the MAC frame may be generated by combining division and concatenation. Padding data may be added to the end of the MAC frame, and a service field may be added to the head. The operation of the first transmission processing unit 102 in the case of the IEEE 802.11 standard will be described later in detail using a specific example.

The first transmission processing unit 102 may decide at least one of the number of symbols or the symbol length to which the first FEC is applied on the basis of priority of data to be transmitted or information of an application. Priority of data or information of an application is associated with at least one of the number of symbols or the symbol length to which the first FEC is applied in advance by association information such as a table or the like. At least one of the number of symbols or the symbol length is decided with reference to the table on the basis of the priority of data or the information of the application provided from the higher layer processing unit 101. Symbol units of the first FEC are decided on the basis of at least one of the decided number of symbols or the decided symbol length, and the input data (target data) is divided in the decided symbol units.

The first transmission processing unit 102 may decide at least one of the number of symbols or the symbol length to which the first FEC is applied on the basis of the quality information of the communication path between the transmission device 100 and the reception device 200. The communication quality may be, for example, the number of times of retransmission of data or first coded data, an error rate of packets, a communication speed, a SINR, an RSSI, a latency request, a reliability request, or the like. As an example, the information on the communication quality is associated with at least one of the number of symbols or the symbol length to which the first FEC is applied in advance by association information such as a table or the like. At least one of the number of symbols or the symbol length to which the first FEC is applied is decided with reference to the table on the basis of the information of the measured communication quality. Symbol units of the first FEC are decided on the basis of at least one of the decided number of symbols or the decided symbol length, and data to be transmitted is divided in the decided symbol units. The measurement of the communication quality may be performed by the first transmission processing unit 102, the higher layer processing unit 101, the second transmission processing unit 104, or the communication unit 106.

The first transmission processing unit 102 may decide at least one of the number of symbols or the symbol length to which the first FEC is applied on the basis of the modulation scheme used for transmission by the communication unit 106, the coding rate of the second code, the coding rate of the first code, or a combination thereof. The modulation scheme, the coding rate of the second code, the coding rate of the first code, or a combination thereof is associated with, for example, at least one of the number of symbols or the symbol length to which the first FEC is applied in advance by association information such as a table or the like. At least one of the number of symbols or the symbol length to which the first FEC is applied is decided with reference to the table on the basis of the modulation scheme, the coding rate of the second code, the coding rate of the first code, or a combination thereof used in the communication unit 106. Symbol units of the first FEC are decided on the basis of at least one of the decided number of symbols or the decided symbol length, and data to be transmitted is divided in the decided symbol units. The modulation scheme, the coding rate of the second code, the coding rate of the first code, or a combination thereof may be decided by either the first transmission processing unit 102 or the second transmission processing unit 104.

The second transmission processing unit 104 performs processing related to the second protocol layer. As an example, the second protocol layer is a physical layer. Note that a part of the processing of the physical layer may be performed by the first transmission processing unit 102. Alternatively, a part of processing of the data link layer may be performed by the second transmission processing unit 104. The second transmission processing unit 104 includes a second FEC encoding unit 105. The second FEC encoding unit 105 generates second coded data by encoding data such as the first coded data or the like provided from the first transmission processing unit 102 using the second code. The second transmission processing unit 104 generates data to be transmitted to the reception device on the basis of the second coded data. The second transmission processing unit 104 provides the generated data to the communication unit 106 as a data frame (transmission frame).

As an example, in the case of the 3GPP standard, the second FEC encoding unit 105 generates a code block by performing encoding with the second code on the basis of the data (including first coded data, a fragment of the first coded data, concatenation of fragments, or the like) provided from the first transmission processing unit 102. The second transmission processing unit 104 concatenates a plurality of code blocks into a transport block, and adds CRC, which is error detection information, to the end of the transport block. If necessary, padding data is added after the CRC. The data after the padding data addition is provided to the communication unit 106 as a data frame (transmission frame). A header may be added to the head of the transport block. The operation in the case of the 3GPP standard described here is an example, and details of the operation of the second transmission processing unit 104 in the case of the 3GPP standard will be described later in detail using a specific example.

As another example, in the case of the IEEE 802.11 standard, the second FEC encoding unit 105 performs encoding with the second code on the basis of the MAC frame (MPDU or A-MPDU) provided from the first transmission processing unit 102. A service field and padding data may be added to the MAC frame. The second transmission processing unit 104 adds a physical header (PHY Header) which is a header of the physical layer to the encoded MAC frame to form a data frame (transmission frame) of the physical layer, and provides the data frame of the physical layer to the communication unit 106. The operation in the case of the IEEE 802.11 standard described here is an example, and details of the operation of the second transmission processing unit 104 in the case of the IEEE 802.11 standard will be described later in detail using a specific example.

The communication unit 106 transmits the data provided from the second transmission processing unit 104 to the reception device via the antenna 108. More specifically, the communication unit 106 modulates the data with a modulation scheme used for transmission, and performs digital-to-analog (DA) conversion on the modulated data. The frequency of the converted analog signal is up-converted, and band filtering is performed according to the frequency of the radio resource used for transmission. The band-filtered signal is amplified, and a radio signal is transmitted from the antenna 108.

Here, the first transmission processing unit 102 may decide whether or not to perform the first FEC (encoding with the first code) on the basis of the service quality request provided from the higher layer processing unit 101. In a case of deciding not to perform the first FEC, the first transmission processing unit 102 generates data (data for code block generation, MAC frame, and the like) to be provided to the second transmission processing unit 104 without performing encoding of the first FEC by the first FEC encoding unit 103. The first transmission processing unit 102 provides the generated data to the second transmission processing unit 104.

Furthermore, the first transmission processing unit 102 or the second transmission processing unit 104 may notify the reception device of information regarding the first FEC (the first encoding by the first code). The information regarding the first FEC includes, as an example, at least one of information indicating that the first encoding is performed, a type of an erasure correction code, the number of symbols and a symbol length to which the first FEC is applied, an index of a symbol to which the first FEC is applied, or a type and a length of error detection information.

Furthermore, the first transmission processing unit 102 may add a header (first header) including information regarding the first FEC to the first coded data. In addition, the second transmission processing unit 104 may add a header (first header) including information regarding the first FEC to the data of the physical layer. Furthermore, the transmission device 100 may transmit the information regarding the first FEC at the time of a connection sequence performed at the time of initial connection with the reception device.

Furthermore, the transmission device 100 may include information regarding the first FEC in the control information or the management information to be transmitted to the reception device. The control information may be information providing notification of a radio resource (a frequency resource, a time resource, a spatial resource, or a combination thereof) used for communication with the reception device. Furthermore, in a case where it is decided that the first FEC is performed from a state where the first FEC is not performed, the transmission device 100 may transmit information regarding the first FEC to the reception device. The transmission device 100 includes a notification unit that notifies the reception device of information regarding the first FEC. The notification unit may be included in the higher layer processing unit 101, the first transmission processing unit 102, the second transmission processing unit 104, or the communication unit 106.

Figure 5:
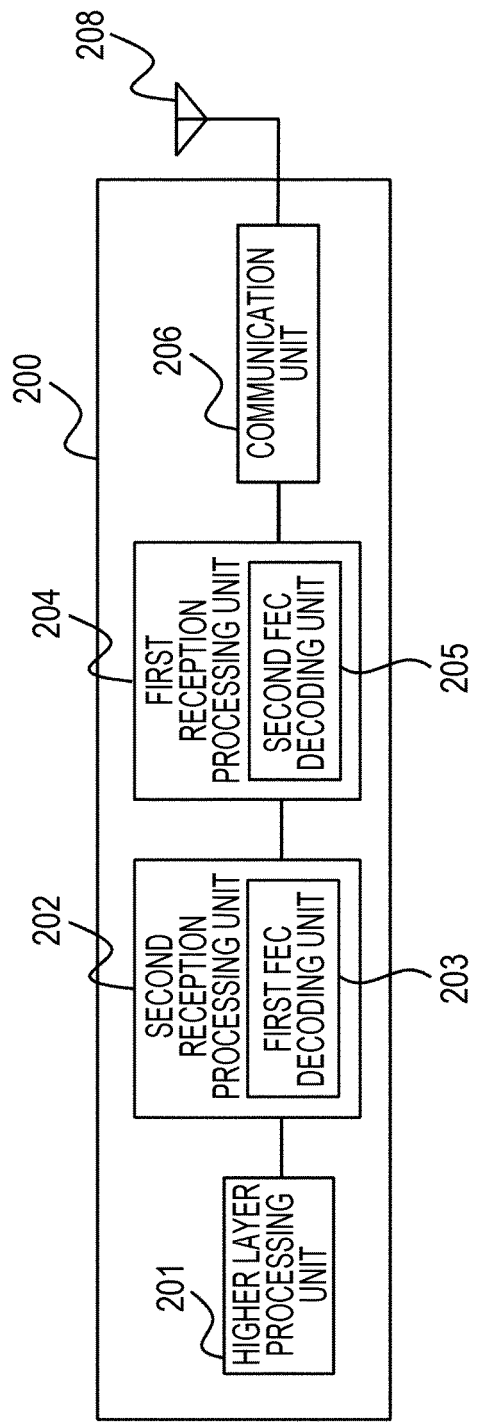
FIG. 5 is a block diagram schematically illustrating an example of a reception device which is an information processing device according to the present embodiment.

FIG. 5 is a block diagram schematically illustrating an example of a reception device which is an information processing device according to the present embodiment. The reception device 200 includes a higher layer processing unit 201, a second reception processing unit (second processing unit) 202, a first reception processing unit (first processing unit) 204, a communication unit 206, and an antenna 208. In the present embodiment, the reception device 200 performs wireless communication, but a configuration for performing wired communication is also not excluded. In this case, the antenna 208 may not be provided.

The communication unit 206 receives a radio signal from the transmission device 100 via the antenna 208. The communication unit 206 performs low noise amplification on the received radio signal, performs frequency down-conversion, band filtering, and the like, and performs analog to digital (AD) conversion on the analog signal subjected to the band filtering. The digital signal obtained by the AD conversion is demodulated by a demodulation scheme corresponding to the modulation scheme used on the transmission side, and the demodulated data is provided to the first reception processing unit 204 as a data frame of the physical layer.

The first reception processing unit 204 (first processing unit) performs processing related to the second protocol layer (physical layer or the like). The first reception processing unit 204 acquires data (data frame) of the physical layer from the communication unit 206. More specifically, the first reception processing unit 204 acquires, from the communication unit 206, the data frame encoded by the erasure correction code which is the first code and further encoded by the second code. The first reception processing unit 204 includes a second FEC decoding unit 205. The second FEC decoding unit 205 decodes the acquired data frame by a decoding scheme corresponding to the second code, and acquires decoded data. The first reception processing unit 204 provides the decoded data to the second reception processing unit 202. In a case where the error detection information (CRC or the like) is added to the acquired data, the first reception processing unit 204 performs CRC determination and provides a result of the CRC determination to the second reception processing unit 202.

As an example, in the case of the 3GPP standard, the first reception processing unit 204 performs CRC determination on the transport block. The second FEC decoding unit 205 performs decoding of the second FEC for each code block. The first reception processing unit 204 provides the decoded data (for example, the first encoded symbol) of each code block to the second reception processing unit 202 together with the determination result of the CRC of the transport block. The operation in the case of the 3GPP standard described here is an example, and details of the operation of the first reception processing unit 204 in the case of the 3GPP standard will be described later in detail using a specific example.

As another example, in the case of the IEEE 802.11 standard, the first reception processing unit 204 processes the header of the data frame of the physical layer. The first reception processing unit 204 decodes the data subjected to the header processing by a decoding scheme corresponding to the second code to acquire the MAC frame. Note that a service field may be added to the MAC frame. The first reception processing unit 204 provides the acquired MAC frame to the second reception processing unit 202. The operation in the case of the IEEE 802.11 standard described here is an example, and details of the operation of the first reception processing unit 204 in the case of the IEEE 802.11 standard will be described later in detail using a specific example.

The second reception processing unit 202 (second processing unit) acquires data from the first reception processing unit 204. The second reception processing unit 202 includes a first FEC decoding unit 203. The first FEC decoding unit 203 decodes the acquired data by a decoding scheme corresponding to the first code (erasure correction code). The first FEC decoding unit 203 determines the error detection information added to the acquired data as an example, and specifies data whose determination result is OK. Data whose determination result is NG is regarded as lost data, and decoding is performed on the basis of data whose determination result is OK. In a case where the decoding is successful, the second reception processing unit 202 provides the data to the higher layer processing unit 201. In a case where the decoding fails (in a case where there is an error in the decoded data), a retransmission request (automatic repeat request (ARQ), hybrid ARQ (HARQ), or the like) is transmitted to the transmission device 100. The first FEC decoding unit 203 may acquire information regarding the first FEC (encoding using the first code) from the transmission device 100 and perform decoding on the basis of the acquired information.

As an example, in the case of the 3GPP standard, in a case where the information of OK is acquired from the first reception processing unit 204 as a result of the CRC determination of the transport block, the second reception processing unit 202 judges that all the code blocks included in the transport block have been correctly received. The first FEC decoding unit 203 decodes the data provided from the first reception processing unit 204, and provides the decoded data (correctly decoded) to the higher layer processing unit 201. In a case where the result of the CRC determination of the transport block is NG, the CRC determination of the data (for example, the first encoded symbol) provided from the first reception processing unit 204 is performed. The first FEC decoding unit 203 regards an encoded symbol whose CRC determination result is NG as a lost symbol, and performs decoding using an encoded symbol whose CRC determination result is OK. In a case where the decoding is successful, the second reception processing unit 202 provides the data to the higher layer processing unit 201. Furthermore, the second reception processing unit 202 transmits an acknowledgement response (ACK) to the transmission device 100. In a case where the decoding fails (In a case where there is an error in the decoded data or in a case where all the errors cannot be corrected), the second reception processing unit 202 transmits a retransmission request (ARQ, HARQ, or the like) to the transmission device 100 by using an acknowledgement response (NACK). For example, a retransmission request of an encoded symbol whose CRC determination result is NG is transmitted. Alternatively, a retransmission request of an encoded symbol corresponding to an erroneous portion of the decoded data may be transmitted. The encoded symbol requested to be retransmitted may be decided by another method. The operation described here is an example of the operation in the case of the 3GPP standard, and details of the operation of the second reception processing unit 202 in the case of the 3GPP standard will be described later using a specific example.

As another example, in the case of the IEEE 802.11 standard, the second reception processing unit 202 acquires the MAC frame from the first reception processing unit 204, processes the service field, and then determines the FCS for each MPDU. The second reception processing unit 202 determines error detection information (FCS or the like) of the first encoded symbol included in the MPDU with respect to the MPDU whose result of the FCS determination is NG. An encoded symbol whose determination result is NG is regarded as a lost symbol. The encoded symbol included in the MPDU whose result of the FCS determination is OK may be regarded as correctly received without performing the FCS determination. The first FEC decoding unit 203 performs decoding by using an encoded symbol whose result of the FCS determination is OK and an encoded symbol which is regarded to be correctly received. In a case where the decoding is successful, the second reception processing unit 202 provides the data to the higher layer processing unit 201. Furthermore, the second reception processing unit 202 transmits an acknowledgement response (ACK) to the transmission device 100. In a case where the decoding fails (In a case where there is an error in the decoded data or in a case where all the errors cannot be corrected), the second reception processing unit 202 transmits a retransmission request (ARQ, HARQ, or the like) to the transmission device 100 by using an acknowledgement response (NACK). For example, a retransmission request of an encoded symbol whose result of the FCS determination is NG is transmitted. Alternatively, a retransmission request of an encoded symbol corresponding to an erroneous portion of the decoded data may be transmitted. The encoded symbol requested to be retransmitted may be decided by another method. The operation described here is an example of the operation in the case of the IEEE 802.11 standard, and details of the operation of the second reception processing unit 202 will be described later using a specific example.

The higher layer processing unit 201 performs processing of the higher layer. For example, the higher layer processing unit 201 passes the data provided from the second reception processing unit 202 to the application.

The communication quality between the reception device 200 and the transmission device 100 may be measured by the reception device 200. In this case, the reception device 200 may transmit information on the measured communication quality to the transmission device 100.

Figure 6:
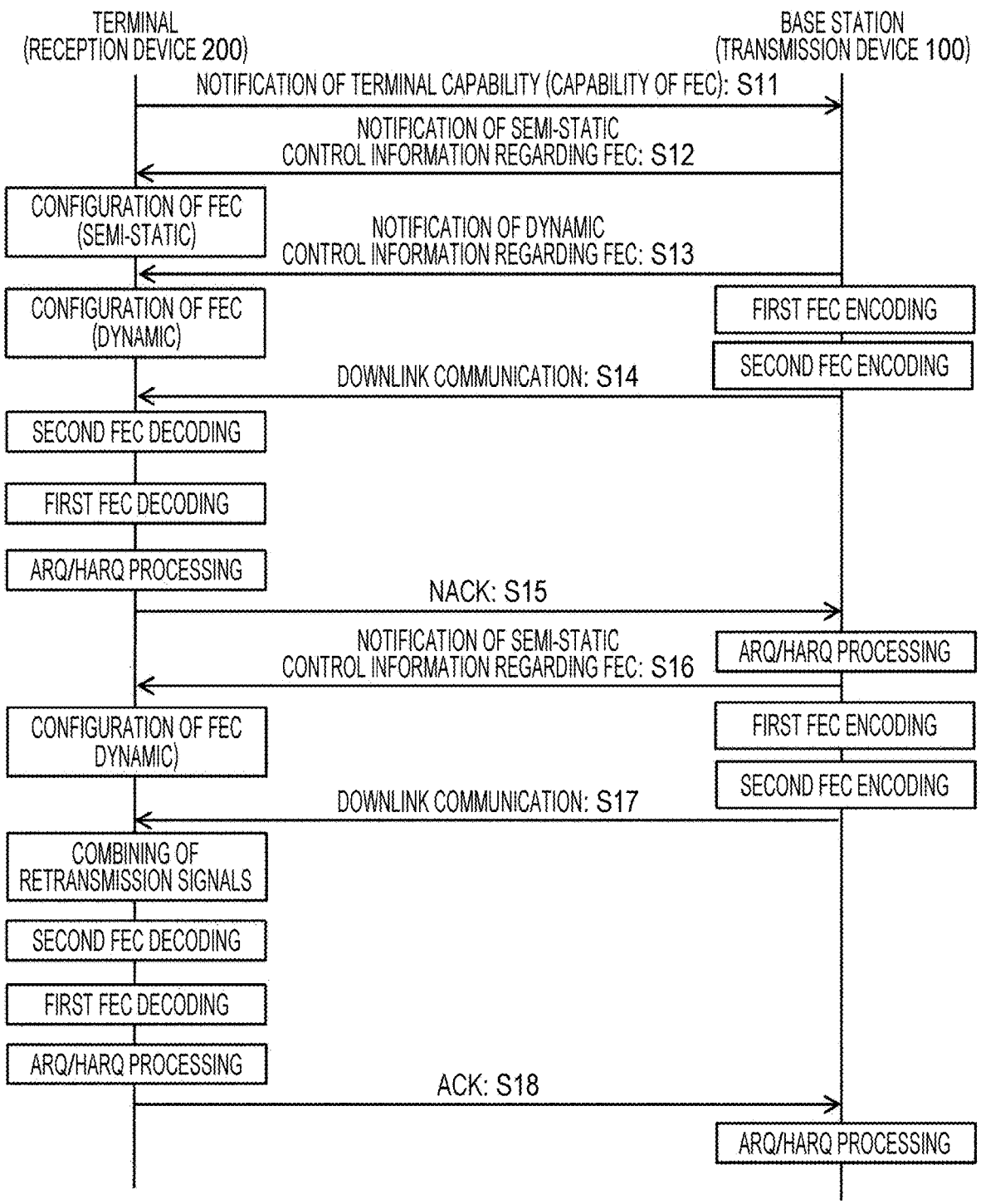
FIG. 6 is a diagram illustrating an example of a basic procedure of a communication sequence according to the present embodiment.

FIG. 6 illustrates an example of a basic procedure of a communication sequence according to the present embodiment. The figure illustrates an example of downlink communication from a base station to a terminal. Here, the base station is the transmission device 100 and the terminal is the reception device 200, but the present invention is not limited to this case. The terminal may be a transmission device, and the base station may be a reception device. Here, the case of the 3GPP standard will be assumed, but a similar procedure can be performed in the case of the IEEE 802.11 standard.

First, the terminal notifies the base station of the cell to which the terminal itself is connected of information (terminal capability information) regarding the capability of the terminal (S11). As an example, the terminal capability information includes information regarding the capability of the first FEC and the capability of the second FEC. Notification of the terminal capability information is provided during an initial connection (initial access) procedure or provided after the initial connection. As a physical channel for notification, at least one of a random access channel (physical random access channel (PRACH)), an uplink control channel (physical uplink control channel (PUCCH)), or an uplink shared channel (physical uplink shared channel (PUSCH)) can be used.

The base station notifies the terminal connected to the cell managed by the base station of semi-static control information including information regarding the first FEC and the second FEC (S12). The semi-static control information may be cell-specific control information. Notification of this control information is provided during the procedure of the initial connection or after the initial connection. Furthermore, notification of the semi-static control information may be provided as part of an RRC procedure such as radio resource control (RRC) signaling, RRC configuration, RRC reconfiguration, and the like. Furthermore, the notification of the semi-static control information may be periodically provided from the base station to the terminal. As a physical channel for providing notification of the control information, at least one of a broadcast channel (physical broadcast channel (PBCH)), a downlink control channel (physical downlink control channel, enhanced physical downlink control channel (EPDCCH)), or a downlink shared channel (physical downlink shared channel) can be used.

Thereafter, in a case where downlink communication specifically occurs from the base station to the terminal, the base station notifies the terminal of control information (dynamic control information) such as a radio resource or the like used for the downlink communication from the base station (S13). Examples of occurrence of downlink communication from the base station to the terminal include a case where the terminal requests data download (pull), a case where push data occurs to the terminal, or the like.

The dynamic control information may include terminal-specific (UE-specific) or terminal-group-specific (UE-group-specific) control information. Here, the terminal group is, for example, a group of one or more terminals that are transmission destination targets in a case where the downlink communication is multicast or broadcast.

Examples of the dynamic control information include a frequency resource, a time resource, and a spatial resource for allocating downlink communication to a target terminal (or a terminal group). The frequency resource is, for example, a resource block, a subcarrier, a subcarrier group, or the like. The time resource is, for example, a subframe, a slot, a mini-slot, a symbol, or the like. The spatial resource is, for example, an antenna, an antenna port, a spatial layer, a spatial stream, or the like.

Furthermore, other examples of the dynamic control information include information regarding a non-orthogonal resource (power-related resources, interleave patterns, scramble patterns, diffusion patterns, or the like) of non-orthogonal multiple access ((NOMA), multiuser superposition transmission (MUST), interleave division multiple access (IDMA), code division multiple access (CDMA)).

Furthermore, other examples of the dynamic control information include information regarding a modulation order, information regarding a modulation scheme, information regarding an encoding method and a coding rate of the second FEC, information regarding an encoding method and a coding rate of the first FEC, a setting related to ARQ/HARQ (new data indicator (NDI), redundancy version (RV), and the like), and the like. The modulation order represents the bit depth that can be transmitted with modulation symbols using a modulation scheme. The combination of the coding rate and the modulation scheme of the second FEC corresponds to, for example, a modulation and coding set (MCS).

The terminal that has received the dynamic control information performs setting for preparation for appropriate reception of downlink communication according to the received control information.

The base station transmits data of downlink communication to the terminal to the terminal on the basis of the control information notification of which is provided to the terminal (S14). More specifically, the base station encodes the data of the downlink communication by the first FEC, encodes the data encoded by the first FEC by the second FEC, and modulates the data encoded by the second FEC. The modulated data is converted into an analog signal, amplified, and then transmitted as a radio signal via an antenna. As a result, the radio signal is transmitted to the terminal.

The terminal receives a radio signal from the base station, performs AD conversion and demodulation on the received radio signal, further decodes the received radio signal by the second FEC, and further decodes the received radio signal by the first FEC. The demodulation, the second FEC decoding, and the first FEC decoding are performed according to the setting specified by the control information from the base station. The terminal transmits an ACK or a NACK (In the following, ACK/NACK) from the terminal to the base station depending on whether decoding of the data (original data) is successful or failed. In a case where the decoding fails, NACK is transmitted (S15), and in a case where the decoding succeeds, ACK is transmitted (S18).

The setting of the ARQ or HARQ processing may be changed depending on whether the data decoding is successful or failed. For example, in a case where the decoding fails, the terminal retransmits the signal for HARQ. In the base station, in order to combine retransmission signals, it is desirable to store a decoding result of data that has failed to be decoded or data that is being decoded (a soft decision value, a log likelihood ratio (LLR), and the like) in a memory. The retransmission in ARQ or HARQ may be retransmission of a symbol (encoded symbol) of the first FEC in which an error is detected, or may be retransmission of an encoded symbol necessary for decoding a data portion of data for which decoding has failed. Alternatively, retransmission of a code block in which an error is detected and retransmission of all blocks of the second FEC are also not excluded. The retransmission may be performed by another method.

The base station performs, according to the ACK/NACK received from the terminal, processing to be performed next. For example, in a case where notification of NACK is received (S15), preparation for retransmission of ARQ or HARQ is performed. Examples of preparation for the retransmission include selection of a redundancy version (RV), selection of a modulation and coding set (MCS), selection of a radio resource, and the like. The base station notifies the target terminal (or terminal group) of the dynamic control information again (S16), and performs the downlink communication according to the setting of the control information (S17).

In a case where the base station receives the ACK from the terminal (S18), the base station judges that the data to be transmitted is correctly received, and the base station moves to a process of transmitting next new data. The base station notifies the target terminal (or terminal group) of the dynamic control information again, and performs downlink communication according to the setting of the control information.

[Example of Generating Data Frame of 3GPP Standard According to Related Art]

Figure 7:
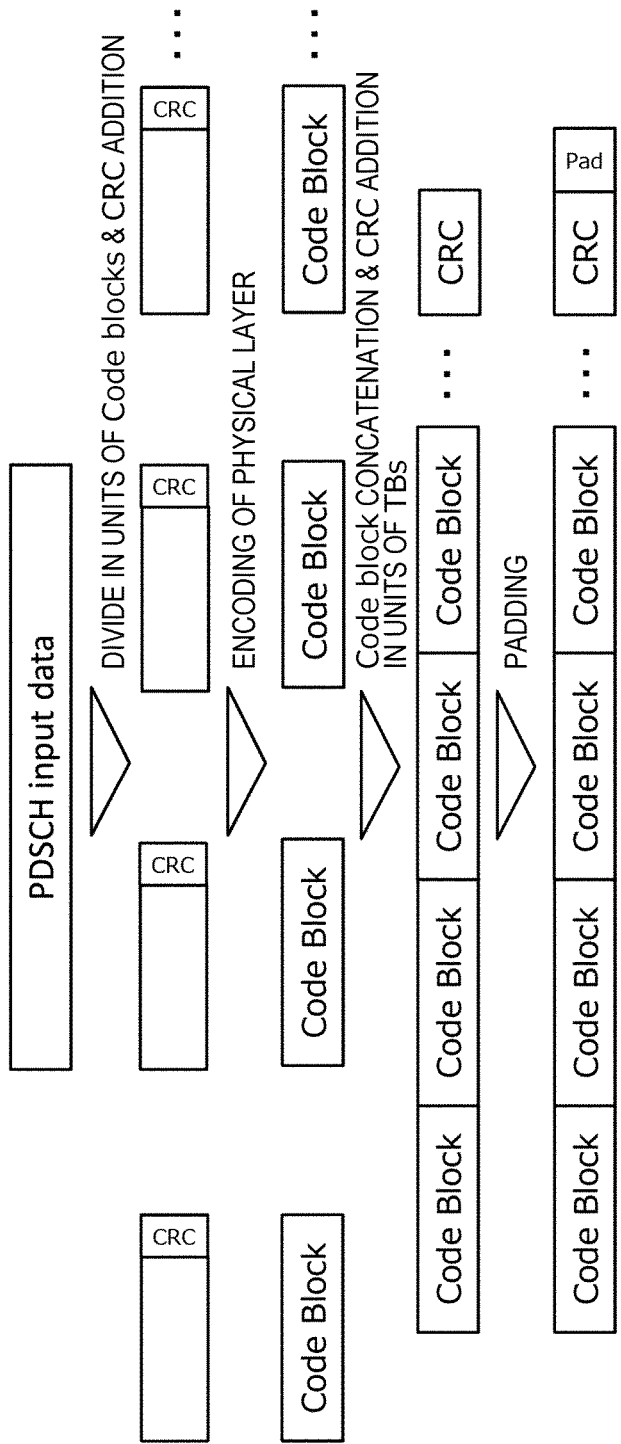
FIG. 7 is a diagram illustrating an example of a procedure for generating a data frame of the 3GPP standard according to the related art.

FIG. 7 illustrates an example of a procedure for generating a data frame (transmission frame) of the 3GPP standard according to the related art. In the transmission device, input data (physical downlink shared channel (PDSCH) input data) to be transmitted is divided into data size units to which the first FEC is applied, and a CRC is added to each of the data size units. Note that data division is performed in the case of data having a certain length or more, and division is not performed in the case of data having a length less than the certain length. The data to which the CRC is added is encoded in the physical layer. The encoding performed here corresponds to the encoding of the second FEC described above. In the related art, encoding of the first FEC is not performed before encoding of the second FEC. A block of encoded data is referred to as a code block. Data retransmission is performed in units of code blocks.

The generated code blocks are concatenated. The concatenated blocks are called transport blocks. A CRC (CRC in units of transport blocks) which is an error detection code is added to the concatenated block, that is, the transport block.

Padding data is added to the end of the transport block to which the CRC is added so as to match the modulation symbol units. Therefore, a data frame is generated. The data frame is transmitted by the transmission device.

An example of a procedure in which the reception device receives the data frame transmitted from the transmission device and performs decoding will be described.

The reception device first performs CRC determination on the transport block. In a case where the result of the CRC determination is successful (OK), all the code blocks included in the transport block have been correctly received. Therefore, the reception device decodes the FEC (corresponding to decoding of the second FEC code), and transmits an acknowledgement response (ACK) to the transmission device.

In a case where the result of the CRC determination is failure (NG), the reception device performs the CRC determination on each code block. The reception device transmits a retransmission request for a code block whose result of the CRC determination is NG to the transmission device by using an acknowledgement response (NACK).

[Example of Generating Data Frame in 3GPP Standard According to Present Embodiment]

In the present embodiment, as described above, a data frame is generated by applying a plurality of FEC encodings stepwise on an information sequence to be transmitted and received.

An outline of a procedure for generating a data frame (transmission frame) according to the present embodiment will be described.

The transmission device 100 divides the input data to be transmitted in symbol units to which the first FEC is applied.

The transmission device 100 performs first FEC encoding (erasure correction coding) on a symbol obtained by division in units of symbols.

Error detection information is added to the encoded symbol obtained by the encoding of the first FEC. A CRC or a syndrome is added as the error detection information. In the present embodiment, a case where a CRC is added will be described. The encoded symbol to which the error detection information is added is referred to as a first encoded symbol.

The transmission device 100 generates data according to the length to which the second FEC is applied by dividing, concatenating, or performing both on the first encoded symbol as necessary so as to match the length to which the second FEC (encoding on the physical layer) is applied. In a case where the first encoded symbol itself matches the length to which the second FEC (encoding on the physical layer) is applied, division and concatenation may not be performed.

The transmission device 100 generates a code block by performing encoding of the second FEC (encoding in the physical layer) on data corresponding to the length to which the second FEC is applied.

The transmission device 100 generates a transport block by concatenating a plurality of code blocks. A CRC (CRC in units of transport blocks) is added to the transport block as error detection information. Other information such as syndrome or the like may be added as the error detection information.

The transmission device 100 adds padding data to the end of the transport block to which the CRC is added so as to match the symbol units of modulation as necessary. Therefore, a data frame that is a transmission frame is generated. The transmission device 100 transmits the data frame to the reception device 200.

The outline of the procedure for generating the data frame according to the present embodiment has been described above. Hereinafter, a specific example of a procedure for generating a data frame according to the present embodiment will be described. Hereinafter, differences from the above description of the outline will be mainly described.

Example 1-1

Figure 8:
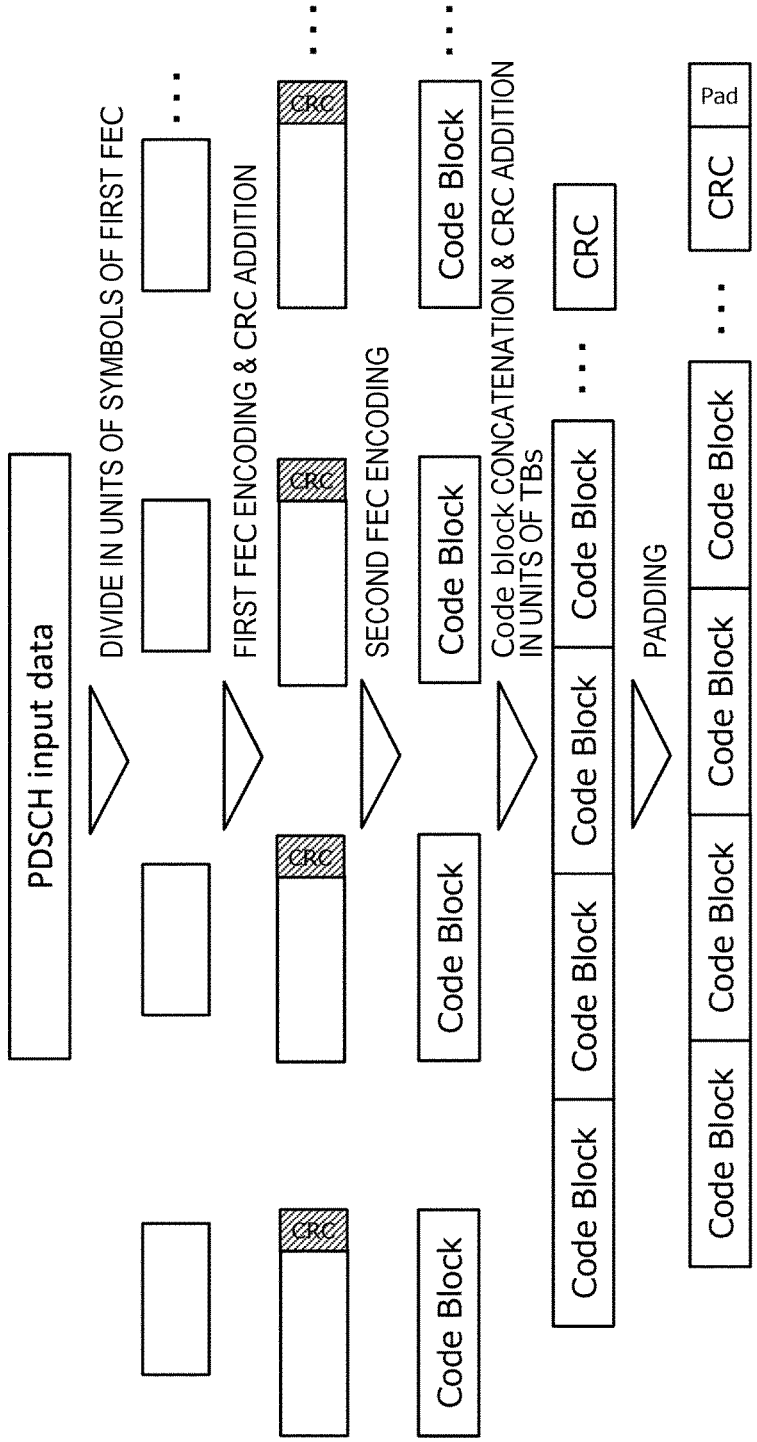
FIG. 8 is a diagram illustrating Example 1-1 of a procedure for generating a data frame in the 3GPP standard according to the present embodiment.

FIG. 8 illustrates Example 1-1 of a procedure for generating a data frame in the 3GPP standard according to the present embodiment. In Example 1-1, a case where the length of a first encoded symbol matches the length to which the second FEC is applied will be described.

First, the transmission device 100 divides the input data in symbol units of the first FEC.

Each symbol obtained by the division is encoded by the first FEC, and a CRC is added to the encoded symbol to generate a first encoded symbol.

The transmission device 100 performs encoding of the second FEC on the first encoded symbol to generate a code block.

The transmission device 100 generates a transport block by concatenating the generated code blocks, and adds CRCs in units of transport blocks. If necessary, padding data is added so as to match the symbol units of modulation, thereby generating a data frame.

Next, an example of a procedure in which the reception device 200 receives the data frame transmitted from the transmission device 100 and performs decoding will be described.

First, the reception device 200 performs CRC determination on the transport block. In a case where the result of the CRC determination is OK, all the code blocks have been correctly received. Therefore, decoding of the second FEC and the first FEC is performed, and an acknowledgement response (ACK) is transmitted to the transmission device 100. Furthermore, data obtained by decoding is provided to the higher layer processing unit 201.

In a case where the result of the CRC determination is NG, the reception device 200 decodes each code block with the second FEC to obtain the first encoded symbol. Then, CRC determination of the first encoded symbol is performed.

An encoded symbol whose CRC determination result is NG is regarded as a lost symbol. The decoding of the first FEC is attempted using the encoded symbol whose result of the CRC determination is OK.

In a case where there is an error in the data obtained by decoding, that is, in a case where all the errors cannot be corrected, retransmission is requested to the transmission device 100 by using an acknowledgement response (NACK).

As an example, the retransmission request is performed on the encoded symbol whose result of the CRC determination is NG. Alternatively, the retransmission request of the encoded symbol corresponding to the data portion in which the error cannot be corrected is performed. An encoded symbol for which retransmission is requested may be decided by another method, and retransmission of the decided encoded symbol may be requested. Note that a target for which retransmission is requested is not limited to an encoded symbol, and may be a code block or the entire original data. This description regarding the request for retransmission is similarly applied to the following description.

Example 1-2

Figure 9:
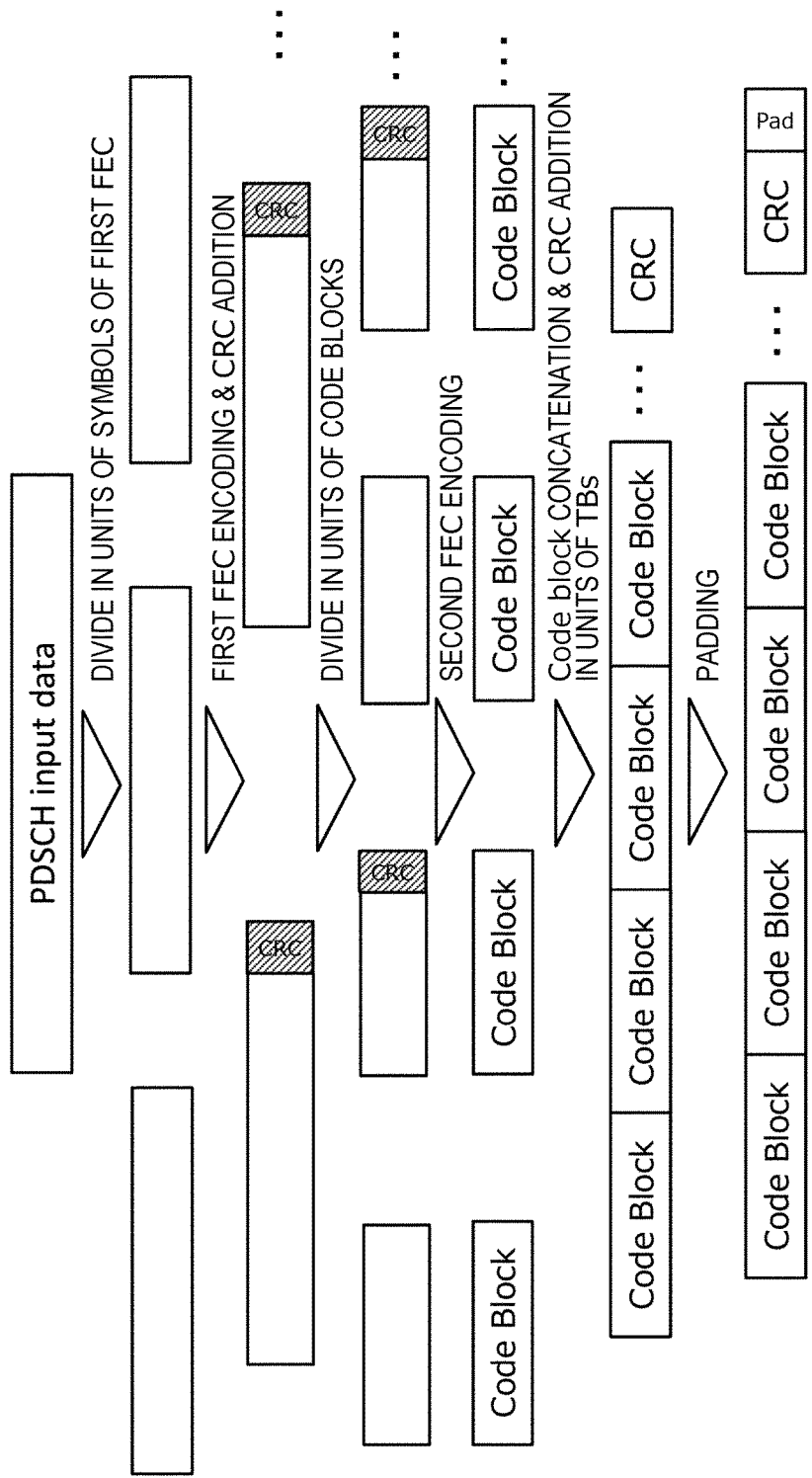
FIG. 9 is a diagram illustrating Example 1-2 of a procedure for generating a data frame in the 3GPP standard according to the present embodiment.

FIG. 9 illustrates Example 1-2 of a procedure for generating a data frame in the 3GPP standard according to the present embodiment. In Example 1-2, a case where the length of a first encoded symbol is longer than the length to which the second FEC is applied will be described.

First, the transmission device 100 divides the input data in symbol units of the first FEC.

Each symbol obtained by the division is encoded by the first FEC, and a CRC is added to the encoded symbol to generate a first encoded symbol.

Next, the transmission device 100 divides the first encoded symbol into a plurality of fragments (divides into two in this example) in accordance with the length to which the second FEC is applied. Code blocks are generated by performing encoding of the second FEC on the divided first encoded symbols (fragments).

The transmission device 100 concatenates the generated code blocks into a transport block, and adds a CRC in units of transport blocks.

Thereafter, padding data is added to the end of the transport block to which the CRC is added so as to match the symbol units of modulation as necessary. Therefore, a data frame that is a transmission frame is generated. The transmission device 100 transmits the data frame to the reception device 200.

Next, an example of a procedure in which the reception device 200 receives the data frame transmitted from the transmission device 100 and performs decoding will be described.

First, the reception device 200 performs CRC determination on the transport block. In a case where the result of the CRC determination is OK, all the code blocks have been correctly received. Therefore, decoding of the second FEC and the first FEC are performed, and an acknowledgement response (ACK) is transmitted to the transmission device 100. In addition, data obtained by decoding is provided to the higher layer processing unit 201.

In a case where the result of the CRC determination is NG, the reception device 200 decodes each code block with the second FEC to obtain divided first encoded symbols (fragments).

A first encoded symbol is obtained by concatenating the divided first encoded symbols. CRC determination is performed for each first encoded symbol, and the first encoded symbol whose CRC determination result is NG is regarded as a lost symbol. The decoding of the first FEC is performed using the first encoded symbol whose result of the CRC determination is OK.

In a case where there is an error in the data obtained by the decoding of the first FEC, that is, in a case where all the errors cannot be corrected, retransmission is requested to the transmission device 100 by using an acknowledgement response (NACK).

Example 1-3

Figure 10:
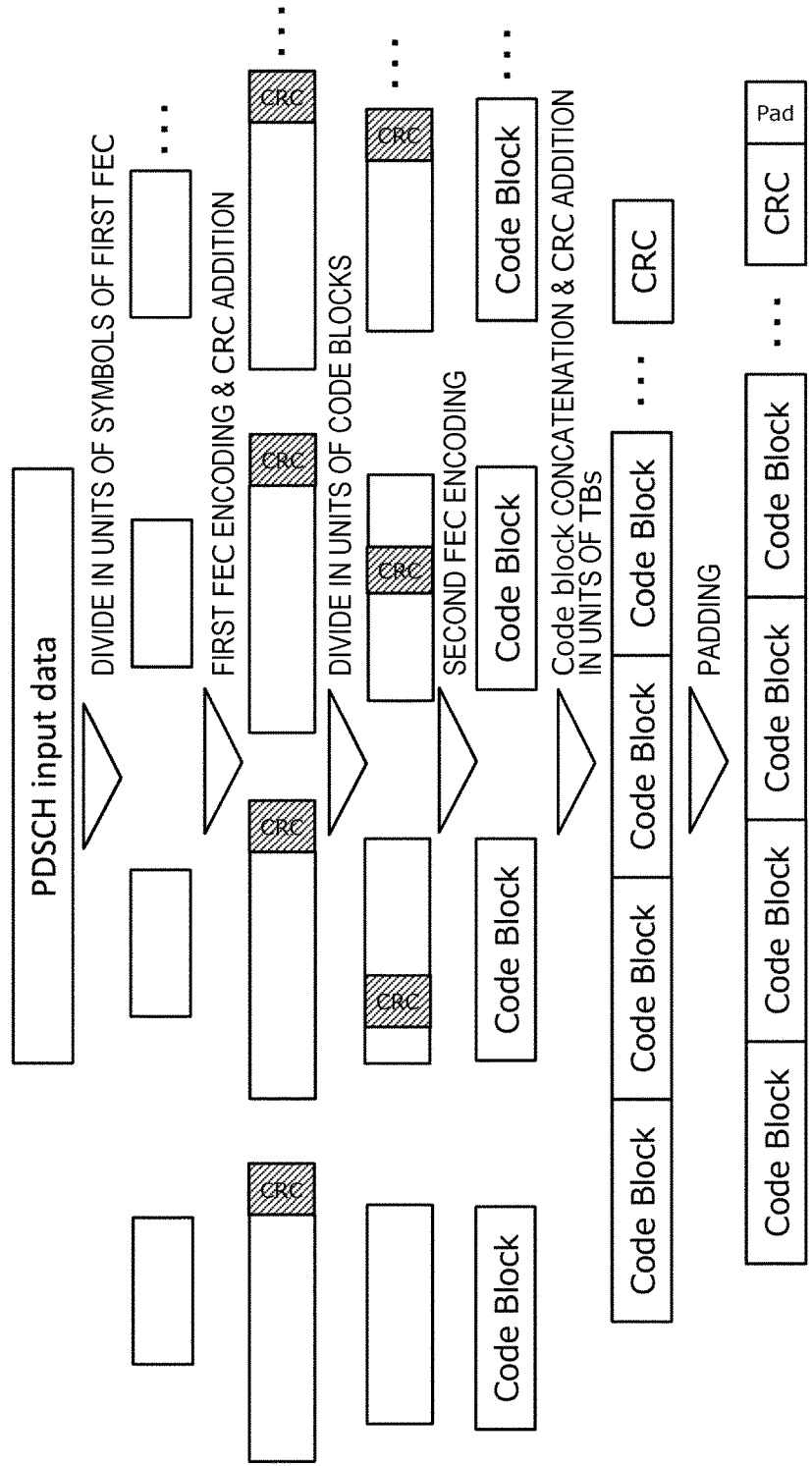
FIG. 10 is a diagram illustrating Example 1-3 of a procedure for generating a data frame in the 3GPP standard according to the present embodiment.

FIG. 10 illustrates Example 1-3 of a procedure for generating a data frame in the 3GPP standard according to the present embodiment. In Example 1-3, similarly to Example 1-2, a case where the length of a first encoded symbol is longer than the length to which the second FEC is applied will be described.

In Example 1-2 described above, the first encoded symbol is divided into two, but in Example 1-3, division and concatenation are performed. In FIG. 10, a part of the head side of the leftmost first encoded symbol is divided corresponding to the first code block. The remaining portion of the leftmost first encoded symbol and a part of the head side of the second first encoded symbol from the left are concatenated and associated with the second code block. The remaining portion of the second first encoded symbol from the left and a part of the head side of the third first encoded symbol from the left are concatenated and associated with the third code block. The same applies hereinafter.

Since it is similar to Example 1-2 except that division and concatenation are performed at the time of transmission, the description thereof will be omitted.

Example 1-4

Figure 11:
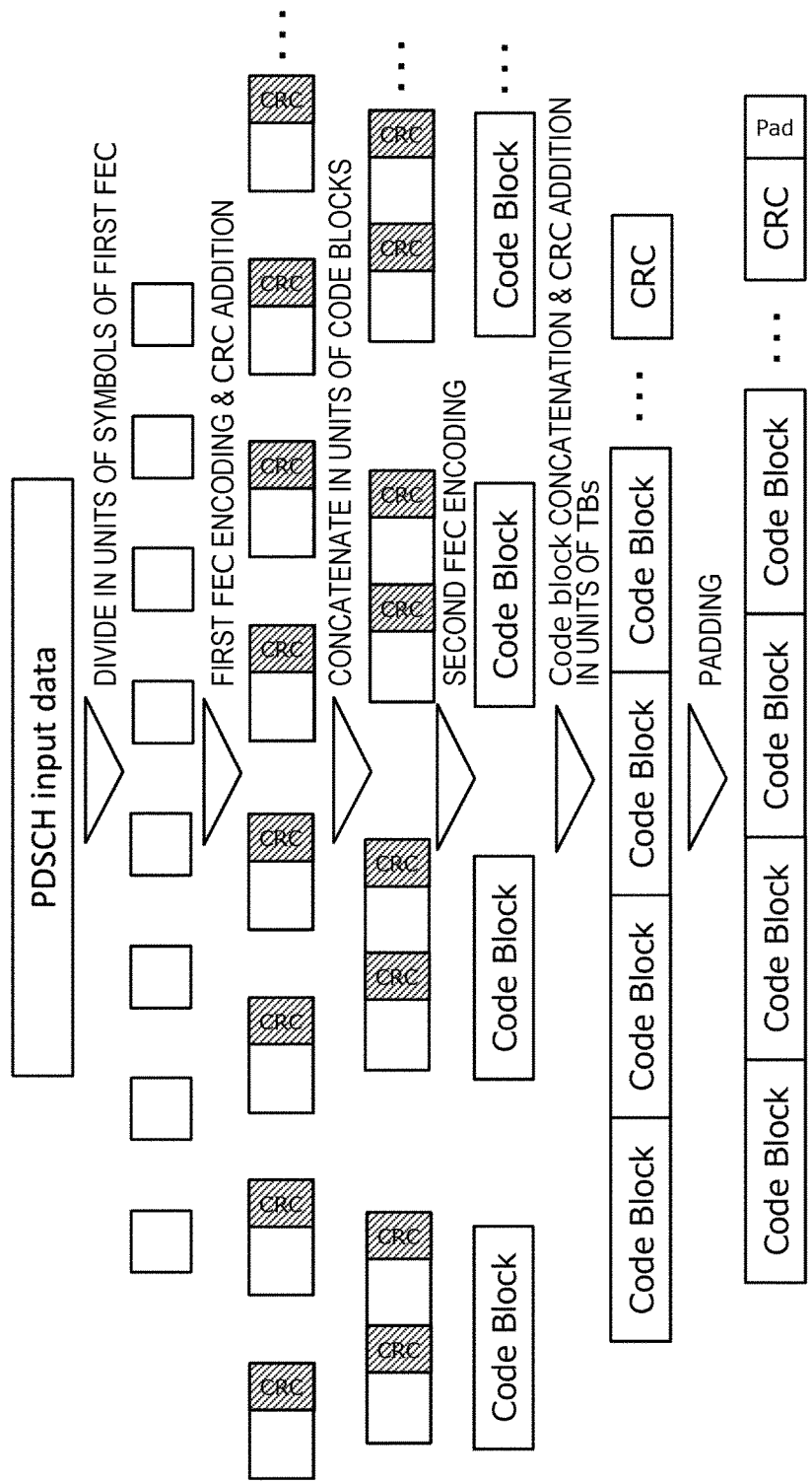
FIG. 11 is a diagram illustrating Example 1-4 of a procedure for generating a data frame in the 3GPP standard according to the present embodiment.

FIG. 11 illustrates Example 1-4 of a procedure for generating a data frame in the 3GPP standard according to the present embodiment. In Example 1-4, a case where the length of a first encoded symbol is shorter than the length to which the second FEC is applied will be described.

First, the transmission device 100 divides the input data in symbol units of the first FEC.

Each symbol obtained by the division is encoded by the first FEC, and a CRC is added to the encoded symbol to generate a first encoded symbol.

Next, the transmission device 100 concatenates first encoded symbols according to the length to which the second FEC is applied (in this example, concatenates two symbols). The size of the concatenated first encoded symbols matches the length to which the second FEC is applied. A code block is generated by performing encoding of the second FEC on the concatenated first encoded symbols. As a result, the code block includes a plurality of CRCs.

The transmission device 100 concatenates the generated code blocks into a transport block, and adds a CRC in units of transport blocks.

Thereafter, padding data is added to the end of the transport block to which the CRC is added so as to match the symbol units of modulation as necessary. Therefore, a data frame that is a transmission frame is generated. The transmission device 100 transmits the data frame to the reception device 200.

Next, an example of a procedure in which the reception device 200 receives the data frame transmitted from the transmission device 100 and performs decoding will be described.

First, the reception device 200 performs CRC determination on the transport block. In a case where the result of the CRC determination is OK, all the code blocks have been correctly received. Therefore, decoding of the second FEC and the first FEC are performed, and an acknowledgement response (ACK) is transmitted to the transmission device 100. In addition, data obtained by decoding is provided to the higher layer processing unit 201.

In a case where the result of the CRC determination is NG, the reception device 200 decodes each code block with the second FEC to obtain concatenated first encoded symbols.

The reception device 200 obtains a first encoded symbol by dividing the concatenated first encoded symbols into two.

The reception device 200 performs CRC determination for each first encoded symbol, and regards the first encoded symbol whose result of the CRC determination is NG as a lost symbol. The decoding of the first FEC is performed using the first encoded symbol whose result of the CRC determination is OK.

In a case where there is an error in the data obtained by the decoding of the first FEC, that is, in a case where all the errors cannot be corrected, retransmission is requested to the transmission device 100 by using an acknowledgement response (NACK).

Example 1-5

Figure 12:
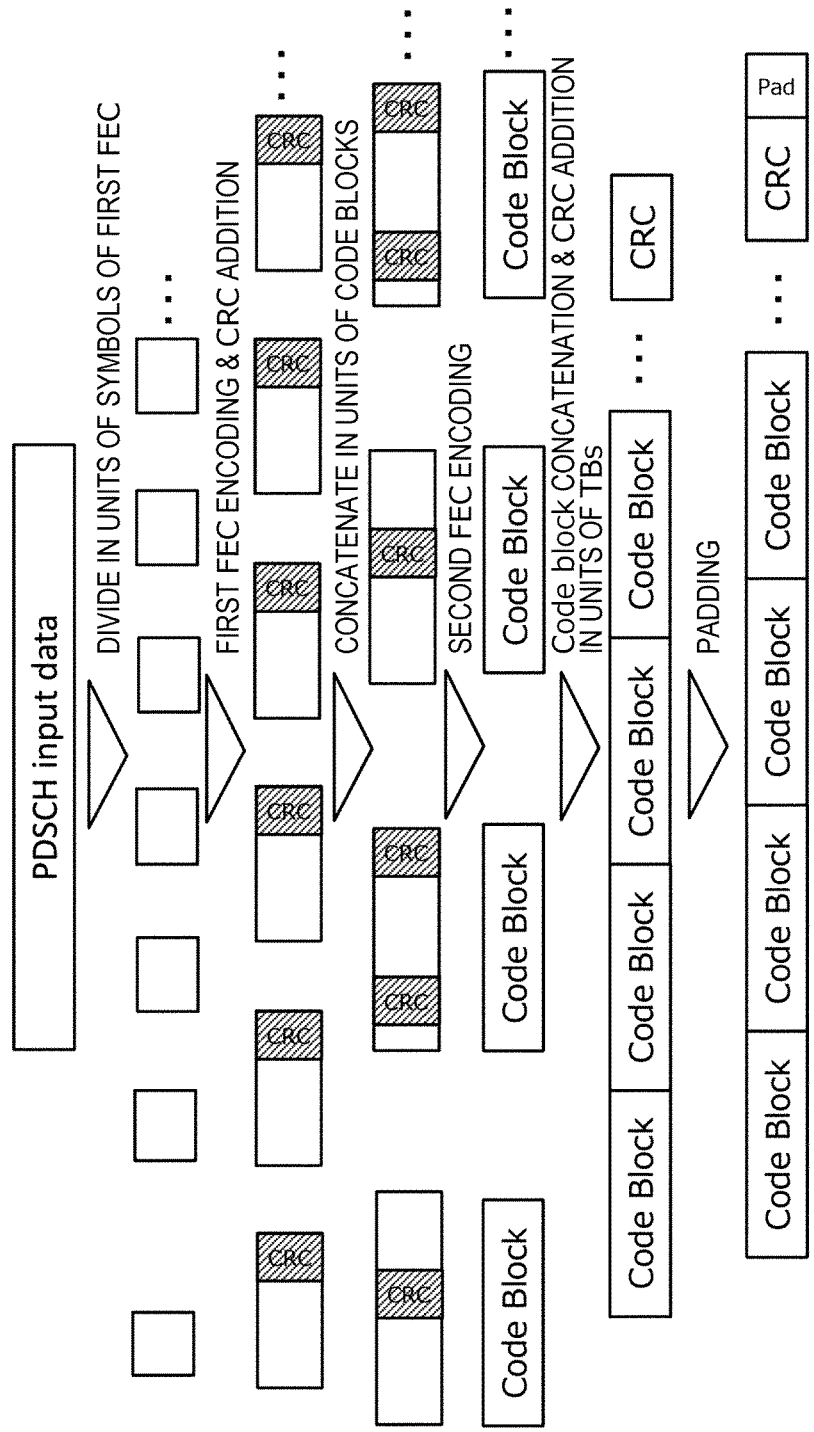
FIG. 12 is a diagram illustrating Example 1-5 of a procedure for generating a data frame in the 3GPP standard according to the present embodiment.

FIG. 12 illustrates Example 1-5 of a procedure for generating a data frame in the 3GPP standard according to the present embodiment. In Example 1-5, similarly to the first-4, a case where the length of a first encoded symbol is shorter than the length to which the second FEC is applied will be described.

In Example 1-4 described above, two first encoded symbols are concatenated, but in Example 1-5, concatenation and division are performed. In FIG. 12, the leftmost first encoded symbol and a part of the head side of the second first encoded symbol from the left are concatenated and associated with the first code block. The remaining portion of the second first encoded symbol from the left and the third first encoded symbol from the left are concatenated and associated with the second code block. That is, data for generating two code blocks (data corresponding to the length to which the second FEC is applied) is generated from three first encoded symbols. The same applies hereinafter.

Since it is similar to Example 1-4 except that concatenation and division are performed at the time of transmission, description thereof is omitted.

Example 1-6

Figure 13:
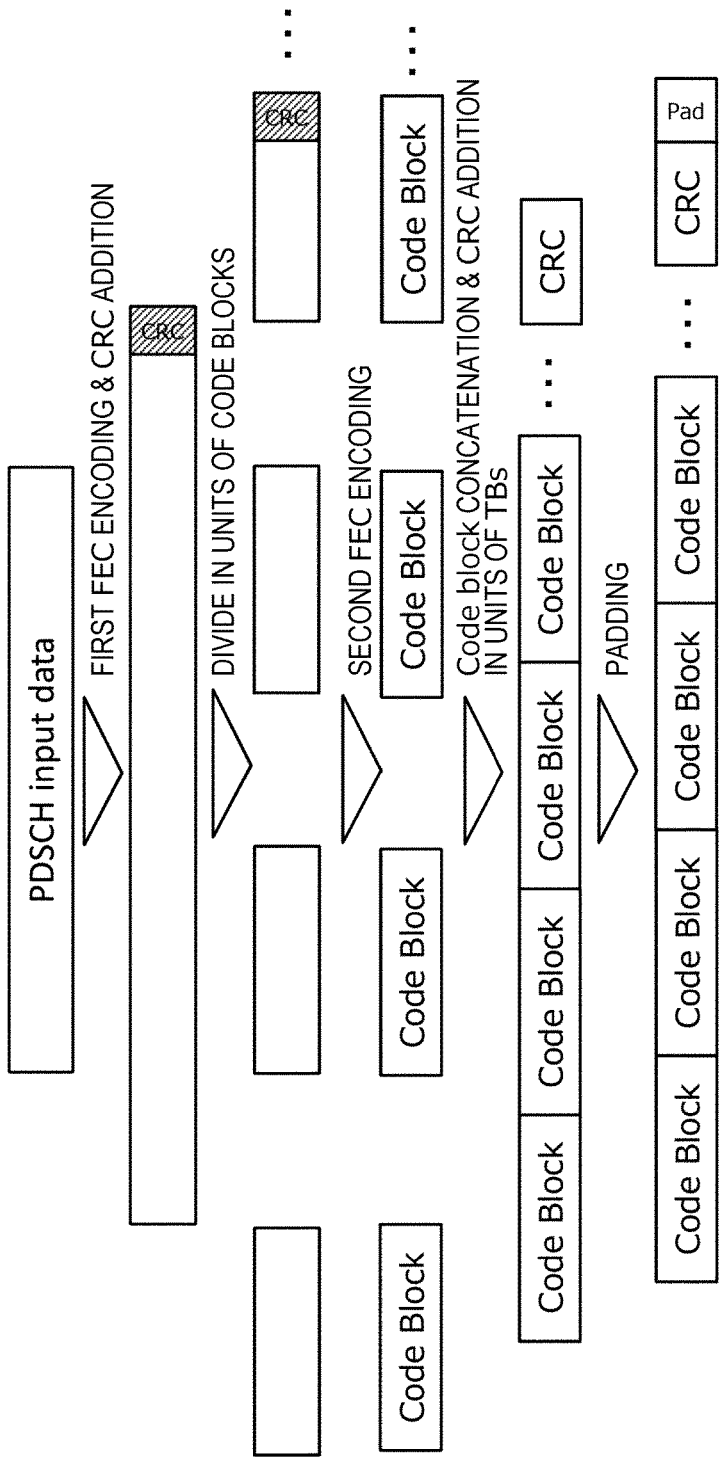
FIG. 13 is a diagram illustrating Example 1-6 of a procedure for generating a data frame in the 3GPP standard according to the present embodiment.

FIG. 13 illustrates Example 1-6 of a procedure for generating a data frame in the 3GPP standard according to the present embodiment. In Example 1-6, a case where the length of a first encoded symbol matches the length of a transport block, more specifically, a case where the length of a first encoded symbol is equal to a value obtained by multiplying the number of code blocks included in a transport block by the length to which the second FEC is applied will be described.

First, the transmission device 100 encodes the input data with the first FEC (encoding with the first code), and adds a CRC to the encoded symbol to generate a first encoded symbol.

Next, the transmission device 100 divides the first encoded symbol into a plurality of fragments (in this example, into four) according to the length to which the second FEC is applied. Code blocks are generated by performing encoding of the second FEC on the divided first encoded symbols (fragments). As a result, there are three code blocks not including the CRC and one code block including the CRC.

The transmission device 100 concatenates the generated code blocks into a transport block, and adds a CRC in units of transport blocks.

Thereafter, padding data is added to the end of the transport block to which the CRC is added so as to match the modulation symbol units. Therefore, a data frame that is a transmission frame is generated. The transmission device 100 transmits the data frame to the reception device 200.

Next, an example of a procedure in which the reception device 200 receives the data frame transmitted from the transmission device 100 and performs decoding will be described.

First, the reception device 200 performs CRC determination on the transport block. In a case where the result of the CRC determination is OK, all the code blocks have been correctly received. Therefore, decoding of the second FEC and the first FEC are performed, and an acknowledgement response (ACK) is transmitted to the transmission device 100. In addition, data obtained by decoding is provided to the higher layer processing unit 201.

In a case where the result of the CRC determination is NG, the reception device 200 decodes each code block with the second FEC to obtain divided first encoded symbols (fragments).

A plurality of (four in this example) divided first encoded symbols is concatenated to obtain a first encoded symbol. CRC determination is performed on the first encoded symbol, and the encoded symbol whose CRC determination result is NG is regarded as a lost symbol. After correctly receiving the number of transport blocks equal to or larger than the number necessary for decoding, the decoding of the first FEC is performed using a plurality of encoded symbols whose CRC determination result is OK.

In a case where there is an error in the data obtained by the decoding of the first FEC, that is, in a case where all the errors cannot be corrected, retransmission is requested to the transmission device 100 by using an acknowledgement response (NACK).

Example 1-7

Figure 14:
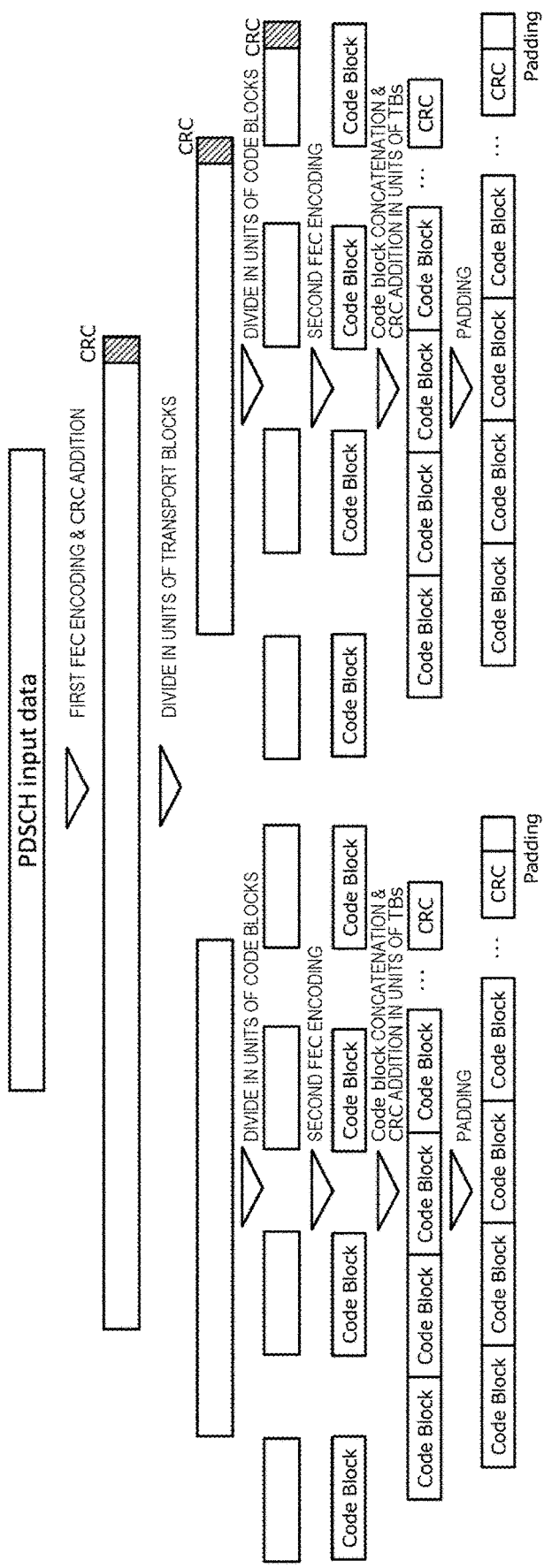
FIG. 14 is a diagram illustrating Example 1-7 of a procedure for generating a data frame in the 3GPP standard according to the present embodiment.

FIG. 14 illustrates Example 1-7 of a procedure for generating a data frame in the 3GPP standard according to the present embodiment. In Example 1-7, a case where the length of a first encoded symbol is longer than a value obtained by multiplying the number of code blocks included in a transport block by the length to which the second FEC is applied will be described.

First, the transmission device 100 encodes the input data with the first FEC, and adds a CRC to the encoded symbol to generate a first encoded symbol. The first encoded symbol is divided into a plurality of fragments (two fragments in the example of the figure) on the basis of the size of a transport block. In the example of the figure, each fragment matches a value obtained by multiplying the number of code blocks included in a transport block by the length to which the second FEC is applied. Processing for the divided first encoded symbols (fragments) is the same as that in Example 1-6 described above, and thus description thereof is omitted.

Figure 15:
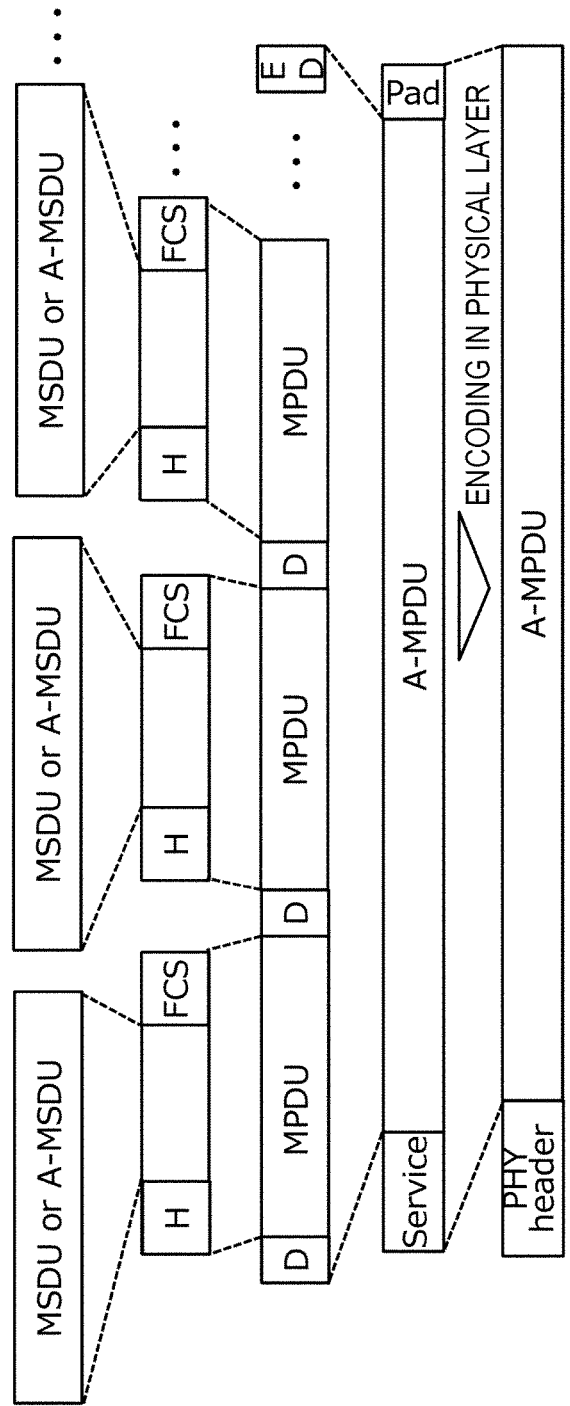
FIG. 15 is a diagram illustrating an example of a procedure for generating a data frame of the IEEE 802.11 standard according to the related art.

Example of Generating Data Frame of IEEE 802.11 Standard According to Related Art FIG. 15 illustrates an example of a procedure for generating a data frame (transmission frame) of the IEEE 802.11 standard according to the related art.

In the transmission device, input data to be transmitted is divided into MAC protocol data units (MPDU) which are retransmission units, and is set as an MSDU or an A-MSDU.

An MPDU header ("H" in the figure) is added to the head of the MSDU or A-MSDU, and a frame check sequence (FCS) which is MPDU error detection information is added to the end.

An MPDU delimiter ("D" in the figure) including information regarding a boundary between MPDUs is added to a head of each MPDU. An aggregated MPDU (A-MPDU) is generated by concatenating MPDUs via MPDU delimiters and adding an MPDU delimiter (EOF MPDU delimiter) ("ED" in the figure) indicating the end to the end.

A service field "Service" and padding data "Pad" are added to the A-MPDU. The encoding of the physical layer is performed on the A-MPDU to which the service field and the padding data are added. This encoding corresponds to the encoding of the second FEC described above.

A data frame is generated by adding a physical header to the A-MPDU after encoding of the second FEC. The data frame is transmitted by the transmission device.

An example of a procedure in which the reception device receives the data frame transmitted from the transmission device and performs decoding will be described.

The reception device performs decoding of the second FEC on the basis of the information set in the physical header.

The A-MPDU obtained by decoding the second FEC is divided into units of MPDUs on the basis of the MPDU delimiter.

An FCS of each MPDU is determined, and for the MPDU in which an error is detected, retransmission is requested to the transmission device by using an acknowledgement response (NACK).

Example of Generating Data Frame of IEEE 802.11 Standard According to Present Embodiment In the present embodiment, a data frame is generated by applying a plurality of FEC encodings stepwise on an information sequence to be transmitted and received.

An outline of a procedure for generating a data frame of the IEEE 802.11 standard according to the present embodiment will be described. The transmission device 100 divides the input data to be transmitted in symbol units to which the first FEC is applied.

The transmission device 100 encodes the symbols obtained by the division with the first FEC. Error detection information (FCS or the like) is added to the symbols encoded by the first FEC to generate first encoded symbols.

The transmission device 100 generates the main body data of the MAC frame by dividing and concatenating the first encoded symbols on the basis of the length of an MPDU. An MPDU is generated by adding an MPDU header, an FCS, and the like to the main body data.

The transmission device 100 adds an MPDU delimiter including information regarding a boundary between MPDUs to a head portion of each MPDU. An aggregated MPDU (A-MPDU) is generated by concatenating MPDUs via MPDU delimiters and adding an MPDU delimiter (EOF MPDU delimiter) indicating the end to the end.

The transmission device 100 adds a service field and padding data to the A-MPDU. The encoding of the second FEC is performed on the A-MPDU to which the service field and the padding data are added.

A data frame is generated by adding a physical header to the A-MPDU after encoding of the second FEC. The data frame is transmitted by the transmission device 100.

Hereinafter, a specific example of a procedure for generating a data frame of the IEEE 802.11 standard according to the present embodiment will be described. Hereinafter, differences from the outlines of the above-described procedures will be mainly described.

First, a case where encoding of the first FEC is applied to an MSDU or an A-MSDU (FIGS. 16 to 24) will be described.

Example 2-1

Figure 16:
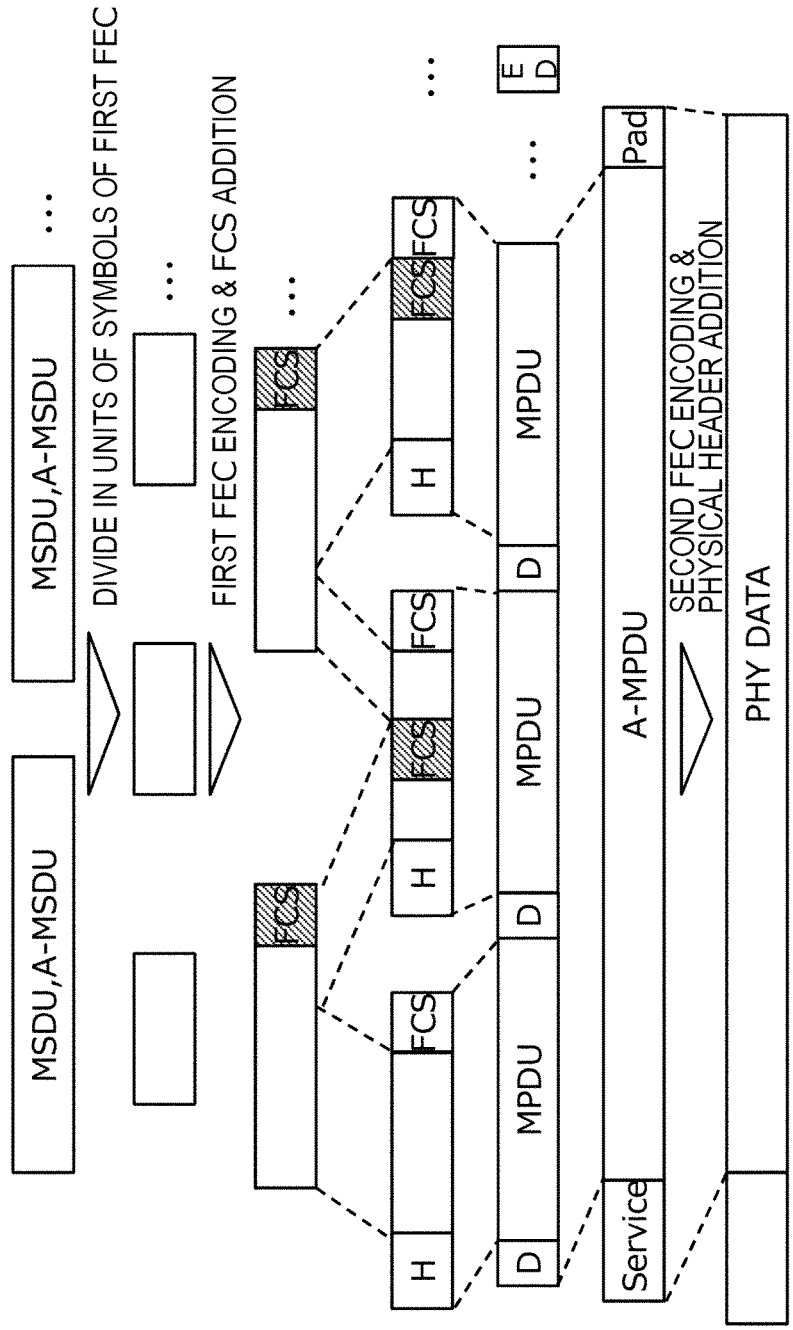
FIG. 16 is a diagram illustrating Example 2-1 of a procedure for generating a data frame of the IEEE 802.11 standard according to the present embodiment.

FIG. 16 illustrates Example 2-1 of a procedure for generating a data frame of the IEEE 802.11 standard according to the present embodiment. Example 2-1 illustrates a case where the first encoded symbol is divided into a plurality of MPDUs and included.

The transmission device 100 divides MSDUs or A-MSDUs in units of symbols to which the first FEC is applied.

The transmission device 100 performs encoding (erasure correction coding) of the first FEC on the symbols obtained by the division. First encoded symbols are generated by adding FCSs as error detection information to the encoded symbols.

The transmission device 100 generates the main body data by dividing and concatenating the first encoded symbols on the basis of the length of an MPDU. An MPDU is generated by adding an MPDU header, an FCS, and the like to the main body data.

The transmission device 100 adds an MPDU delimiter ("D" in the figure) including information regarding a boundary between MPDUs to a head of each MPDU. An aggregated MPDU (A-MPDU) is generated by concatenating MPDUs via MPDU delimiters and adding an MPDU delimiter ("ED" in the figure) indicating the end to the end.

The transmission device 100 adds a service field "Service" and padding data "Pad" to the A-MPDU. The encoding of the second FEC is performed on the A-MPDU to which the service field and the padding data are added.

A data frame is generated by adding a physical header to the A-MPDU after encoding of the second FEC. The data frame is transmitted by the transmission device 100.

An example of a procedure in which the reception device 200 receives the data frame transmitted from the transmission device 100 and performs decoding will be described.

First, the reception device 200 performs decoding of the second FEC on the basis of the information set in the physical header.

The reception device 200 divides the A-MPDU obtained by the decoding of the second FEC into units of MPDUs on the basis of the MPDU delimiters.

The reception device 200 determines the FCS of each MPDU. The main body data of MPDUs (obtained by removing MPDU headers and FCSs from MPDUs) is obtained, and the main body data is concatenated to obtain the first encoded symbols.

In a case where the determination results of the FCSs of the plurality of (two in this example) MPDUs as concatenation sources are all OK, the determinations of the FCSs of the concatenated first encoded symbols are also OK. Therefore, the determinations of the FCSs may be omitted. On the other hand, in a case where at least one of the determinations of the FCSs of the plurality of MPDUs as concatenation sources is NG, determinations of the FCSs of the concatenated first encoded symbols are performed. An encoded symbol whose determination result is NG is regarded as a lost symbol. The reception device 200 attempts to perform decoding of the first FEC by using the encoded symbol whose determination result is OK. In a case where the decoding is successful, an acknowledgement response (ACK) is transmitted to the transmission device 100. In addition, data obtained by decoding is provided to the higher layer processing unit 201.

In a case where there is an error in the data obtained by the decoding of the first FEC, retransmission is requested to the transmission device 100 by using an acknowledgement response (NACK). As an example, the retransmission request is performed on the encoded symbol whose result of the FCS determination is NG. Alternatively, the process is performed on an encoded symbol corresponding to a data portion whose error has not been corrected in the data. The encoded symbol requested to be retransmitted may be decided by another method. This description of the target for which retransmission is requested also applies to the following description.

Example 2-2

Figure 17:
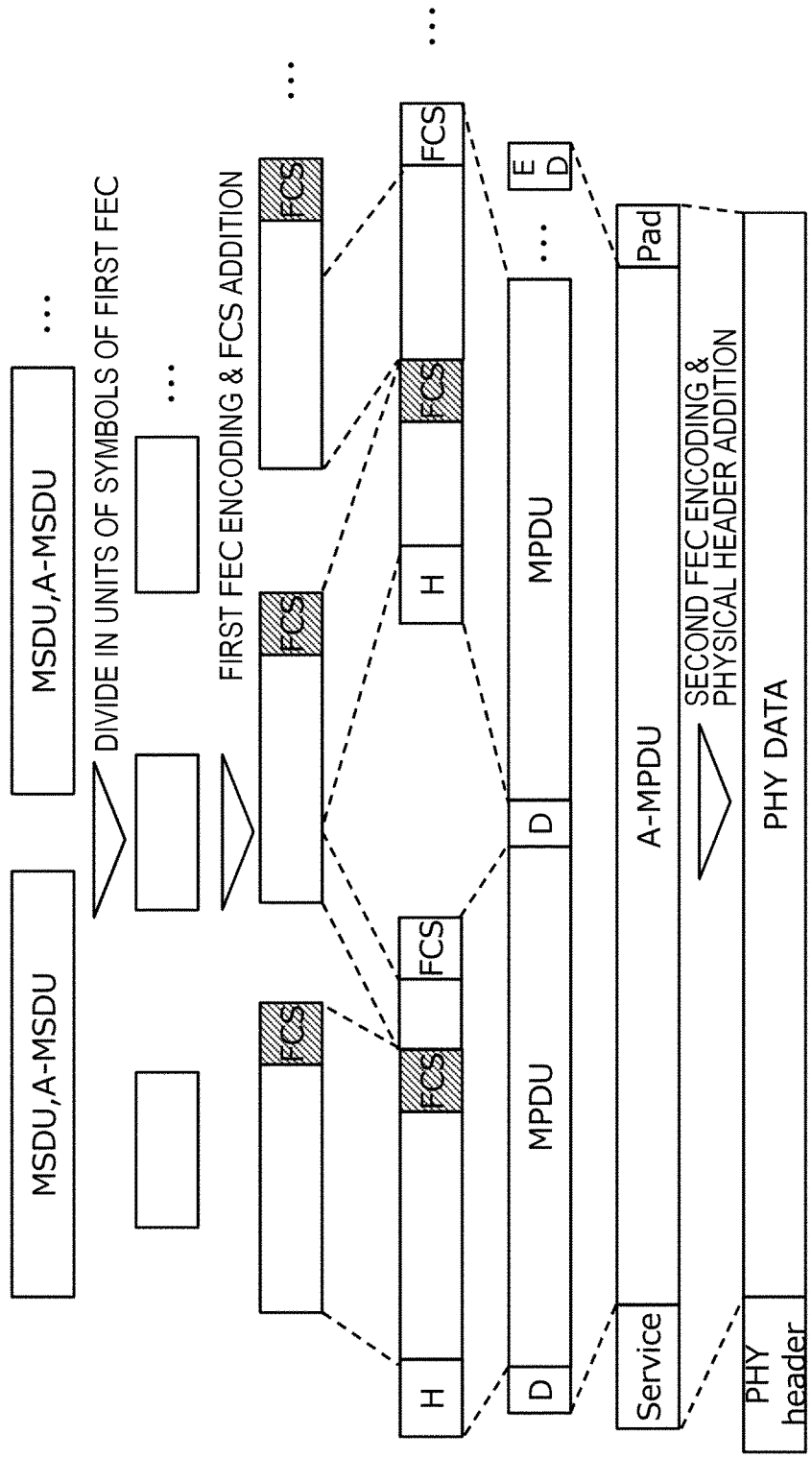
FIG. 17 is a diagram illustrating Example 2-2 of a procedure for generating a data frame of the IEEE 802.11 standard according to the present embodiment.

FIG. 17 illustrates Example 2-2 of a procedure for generating a data frame of the IEEE 802.11 standard according to the present embodiment. Example 2-2 illustrates a case where a plurality of first encoded symbols is at least partially included in an MPDU.

The transmission device 100 divides MSDUs or A-MSDUs in units of symbols to which the first FEC is applied.

The transmission device 100 encodes the symbols obtained by the division with the first FEC. First encoded symbols are generated by adding FCSs as error detection information to the symbols encoded by the first FEC.

The transmission device 100 generates the main body data by at least partially concatenating the plurality of first encoded symbols on the basis of the length of an MPDU. An MPDU is generated by adding an MPDU header, an FCS, and the like to the main body data.

The transmission device 100 adds an MPDU delimiter ("D" in the figure) including information regarding a boundary between MPDUs to a head portion of each MPDU. An aggregated MPDU (A-MPDU) is generated by concatenating MPDUs via MPDU delimiters and adding an MPDU delimiter ("ED" in the figure) indicating the end to the end.

The transmission device 100 adds a service field "Service" and padding data "Pad" to the A-MPDU. The encoding of the second FEC is performed on the A-MPDU to which the service field and the padding data are added.

A data frame is generated by adding a physical header to the A-MPDU after encoding of the second FEC. The data frame is transmitted by the transmission device 100.

An example of a procedure in which the reception device 200 receives the data frame transmitted from the transmission device 100 and performs decoding will be described.

First, the reception device 200 performs decoding of the second FEC on the basis of the information set in the physical header.

The reception device 200 divides the A-MPDU obtained by the decoding of the second FEC into units of MPDUs on the basis of the MPDU delimiters.

The reception device 200 determines the FCS of each MPDU. The main body data of MPDUs (obtained by removing MPDU headers and FCSs from MPDUs) is obtained, and a part of the body data is obtained as a first encoded symbol, or a plurality of pieces of body data is partially concatenated to obtain a first encoded symbol.

In a case where the result of the determinations of the FCSs of the MPDUs that is the acquisition sources of the first encoded symbols are OK, the determinations of the FCSs of the first encoded symbols are also OK. Therefore, the determinations of the FCSs may be omitted. On the other hand, in a case where at least one of the determinations of the FCSs of the plurality of MPDUs as acquisition sources is NG, determinations of the FCSs of the concatenated first encoded symbols are performed. An encoded symbol whose determination result is NG is regarded as a lost symbol. The reception device 200 attempts to perform decoding of the first FEC by using the encoded symbol whose determination result is OK. In a case where the decoding is successful, an acknowledgement response (ACK) is transmitted to the transmission device 100. In addition, data obtained by decoding is provided to the higher layer processing unit 201.

In a case where there is an error in the data obtained by the decoding of the first FEC, retransmission is requested to the transmission device 100 by using an acknowledgement response (NACK).

Example 2-3

Figure 18:
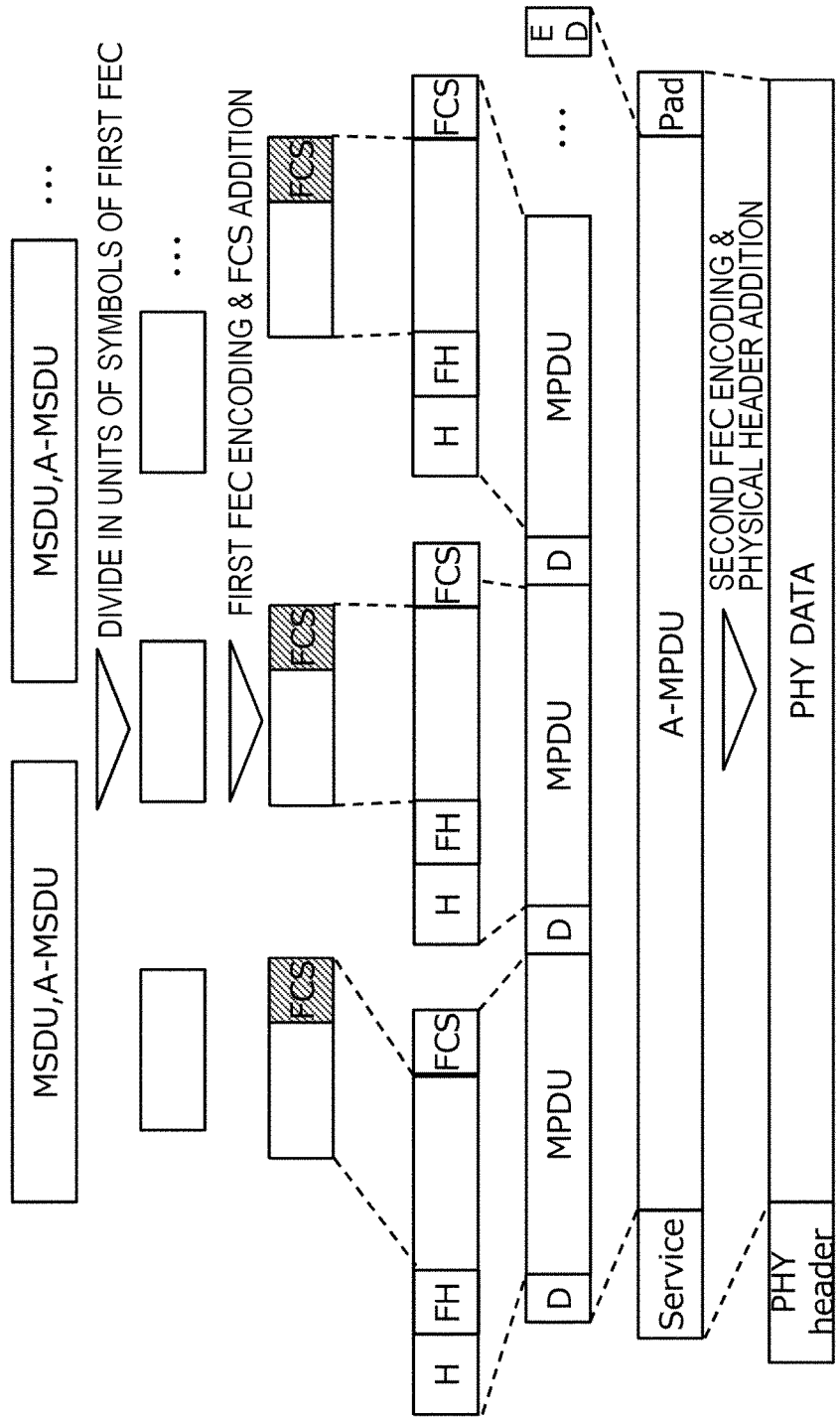
FIG. 18 is a diagram illustrating Example 2-3 of a procedure for generating a data frame of the IEEE 802.11 standard according to the present embodiment.

FIG. 18 illustrates Example 2-3 of a procedure for generating a data frame of the IEEE 802.11 standard according to the present embodiment. In Example 2-3, a first FEC header ("FH" in the figure) of a layer that performs the first FEC is added to each first encoded symbol. That is, the first FEC header is added to the head of an MSDU or A-MSUD. The first FEC header corresponds to an example of a first header including information regarding the first FEC.

Figure 19:
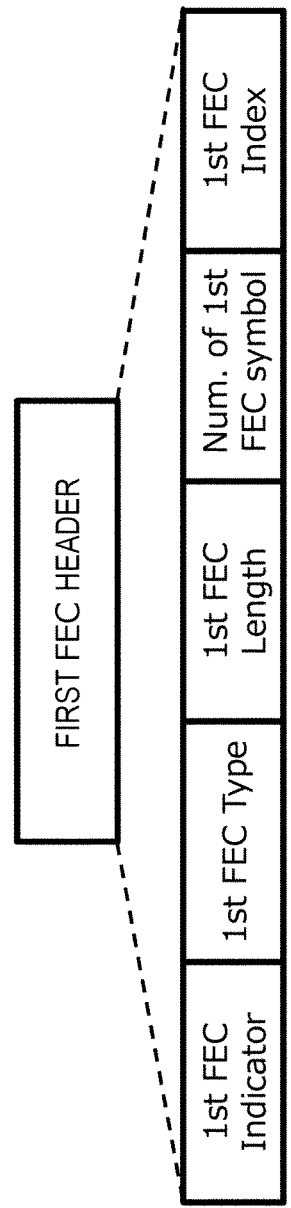
FIG. 19 is a diagram illustrating a format example of a first FEC header.

FIG. 19 illustrates a format example of the first FEC header. The first FEC header includes fields of a first FEC indicator (1st FEC indicator), a first FEC type (1st FEC Type), a first FEC length (1st FEC Length), a number of first FEC symbols (Num. of 1st FEC symbol), and a first FEC index (1st FEC Index).

The first FEC indicator includes information for identifying whether or not encoding of the first FEC is performed (whether or not it is necessary to perform decoding of the first FEC on the reception side). The first FEC type includes information indicating a type (for example, a type of a code) of the first FEC. The first FEC length includes information indicating a symbol length of the first FEC. The first FEC symbol number includes the number of symbols included in the MPDU to which the first FEC header is applied (the number of symbols is 1 in the example of FIG. 18). The first FEC index includes information (sequence number) indicating a position of a symbol in the symbol sequence.

Some of the fields illustrated in FIG. 19 may not exist, or fields other than those illustrated in FIG. 19 may exist. For example, a time stamp field and a total number of symbols field may be included. The reception device 200 can perform decoding of the first FEC using the first FEC header.

Example 2-4

Figure 20:
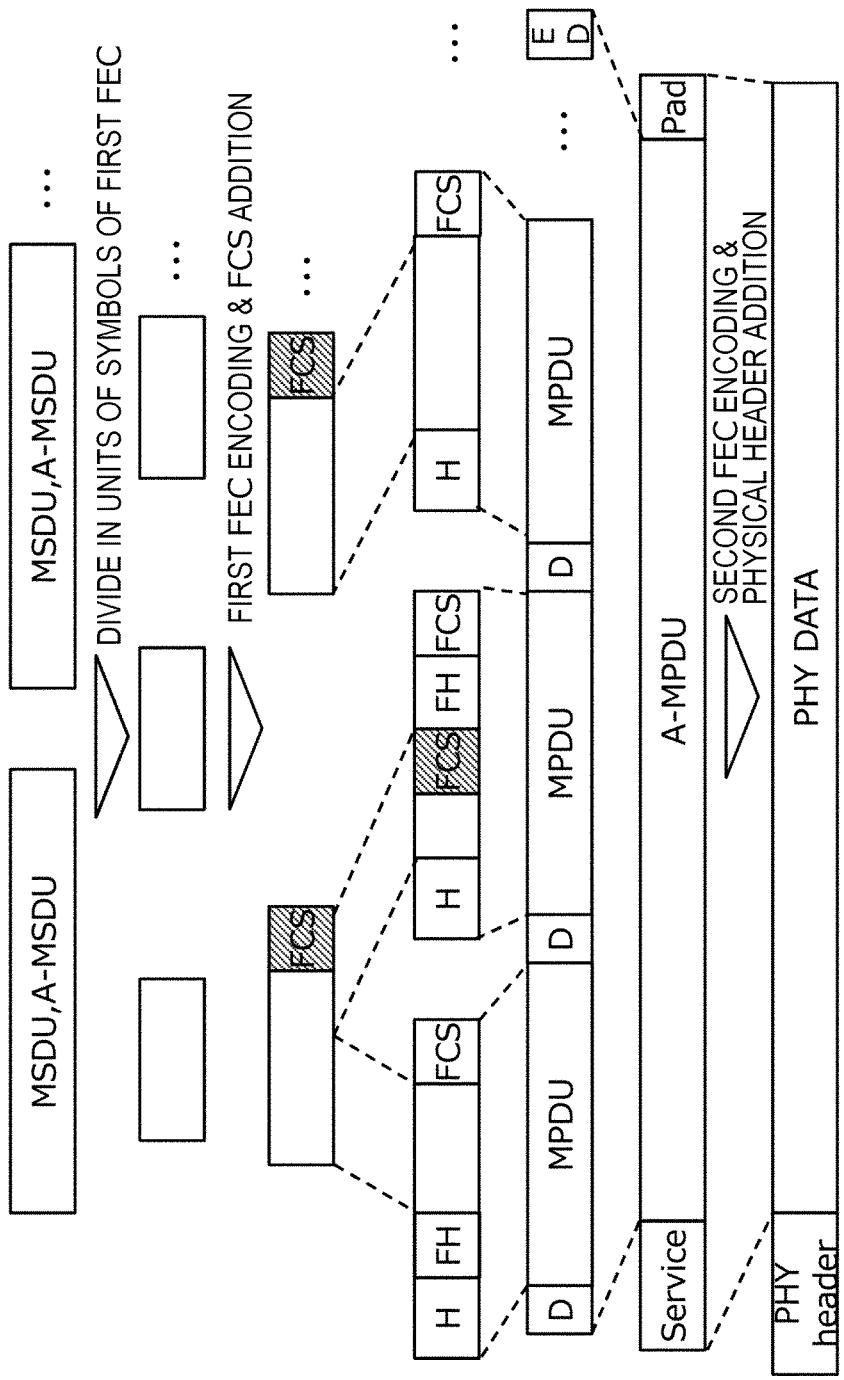
FIG. 20 is a diagram illustrating Example 2-4 of a procedure for generating a data frame of the IEEE 802.11 standard according to the present embodiment.

FIG. 20 illustrates Example 2-4 of a procedure for generating a data frame of the IEEE 802.11 standard according to the present embodiment. Example 2-4 illustrates a case where a first encoded symbol is divided and included in a plurality of MPDUs. A difference from Example 2-3 will be mainly described.

A part of the head side of a first encoded symbol on the left side of the figure is cut out and a first FEC header is added, and then an MPDU header and an FCS are added, so that a first MPDU is generated. The remaining portion of the first encoded symbol and a first FEC header added to a first encoded symbol on the right side of the figure are concatenated. A second MPDU is generated by adding an MPDU header and an FCS to the concatenated data. A third MPDU is generated by adding an MPDU header and an FCS to a portion other than the FCS of a first encoded symbol on the right side of the figure. Fourth and subsequent MPDUs are similarly generated.

Example 2-5

Figure 21:
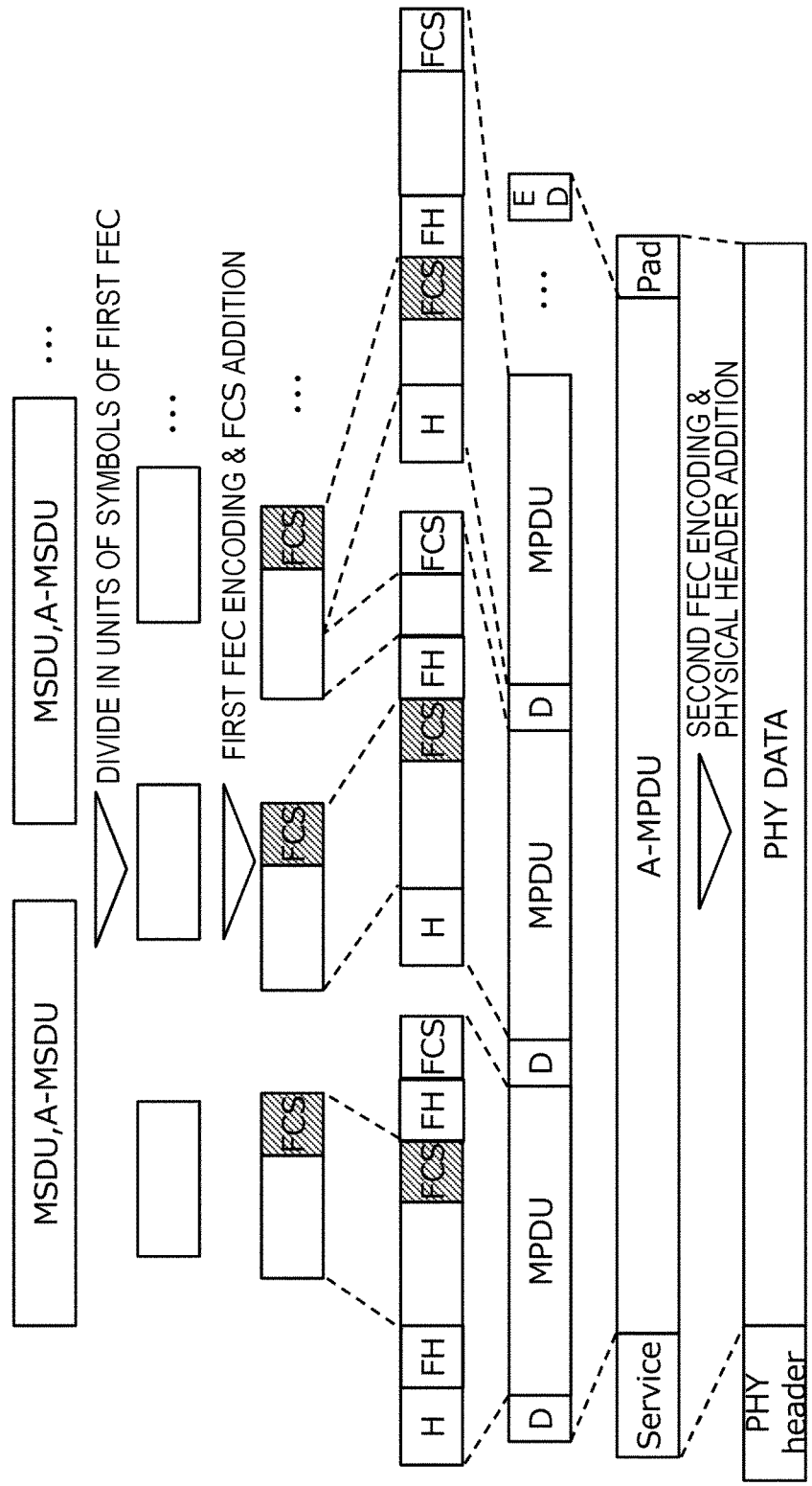
FIG. 21 is a diagram illustrating Example 2-5 of a procedure for generating a data frame of the IEEE 802.11 standard according to the present embodiment.

FIG. 21 illustrates Example 2-5 of a procedure for generating a data frame of the IEEE 802.11 standard according to the present embodiment. Example 2-5 illustrates a case where a first encoded symbol is divided and included in a plurality of MPDUs similarly to Example 2-4 described above. Example 2-5 illustrates a case where a plurality of first FEC headers is included in an MPDU. A difference from Example 2-4 will be mainly described.

A leftmost first encoded symbol in the figure and a first FEC header added to a second first encoded symbol from the left are concatenated, and an MPDU header and an FCS are added, so that a first MPDU is generated. As a result, the first MPDU includes two first FEC headers. The second first encoded symbol from the left, a first FEC header of a third first encoded symbol from the left, and a part of the head side of the third first encoded symbol from the left are concatenated. A second MPDU is generated by adding an MPDU header and an FCS to the concatenated data. Thereafter, third and subsequent MPDUs are similarly generated.

Example 2-6

Figure 22:
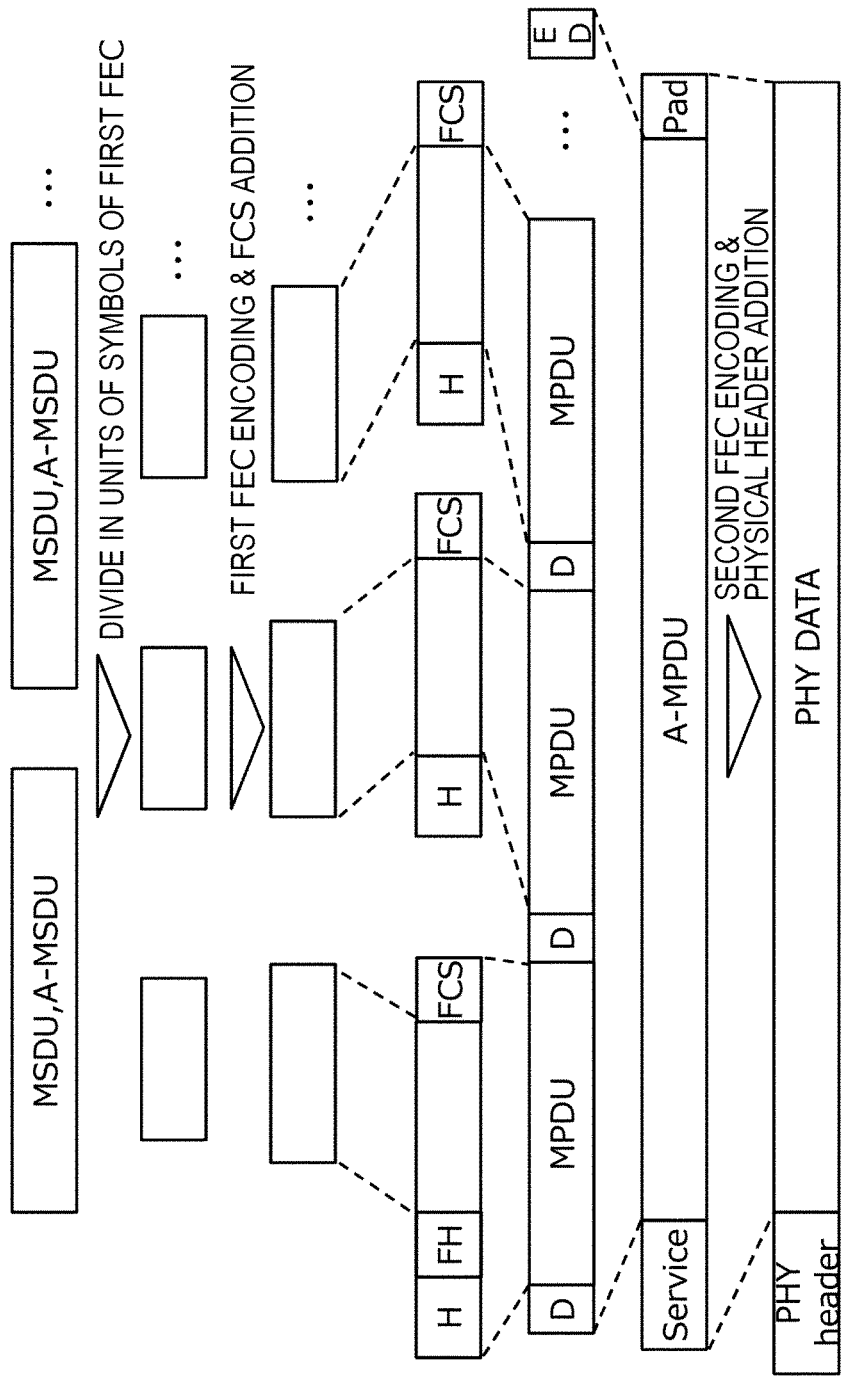
FIG. 22 is a diagram illustrating Example 2-6 of a procedure for generating a data frame of the IEEE 802.11 standard according to the present embodiment.

FIG. 22 illustrates Example 2-6 of a procedure for generating a data frame of the IEEE 802.11 standard according to the present embodiment. Example 2-6 adds a first FEC header only to a first encoded symbol at the head in Example 2-3 (see FIG. 18) described above. The first FEC header also includes information regarding first encoded symbols included in second and subsequent MPDUs. The rest is similar to Example 2-3.

Example 2-7

Figure 23:
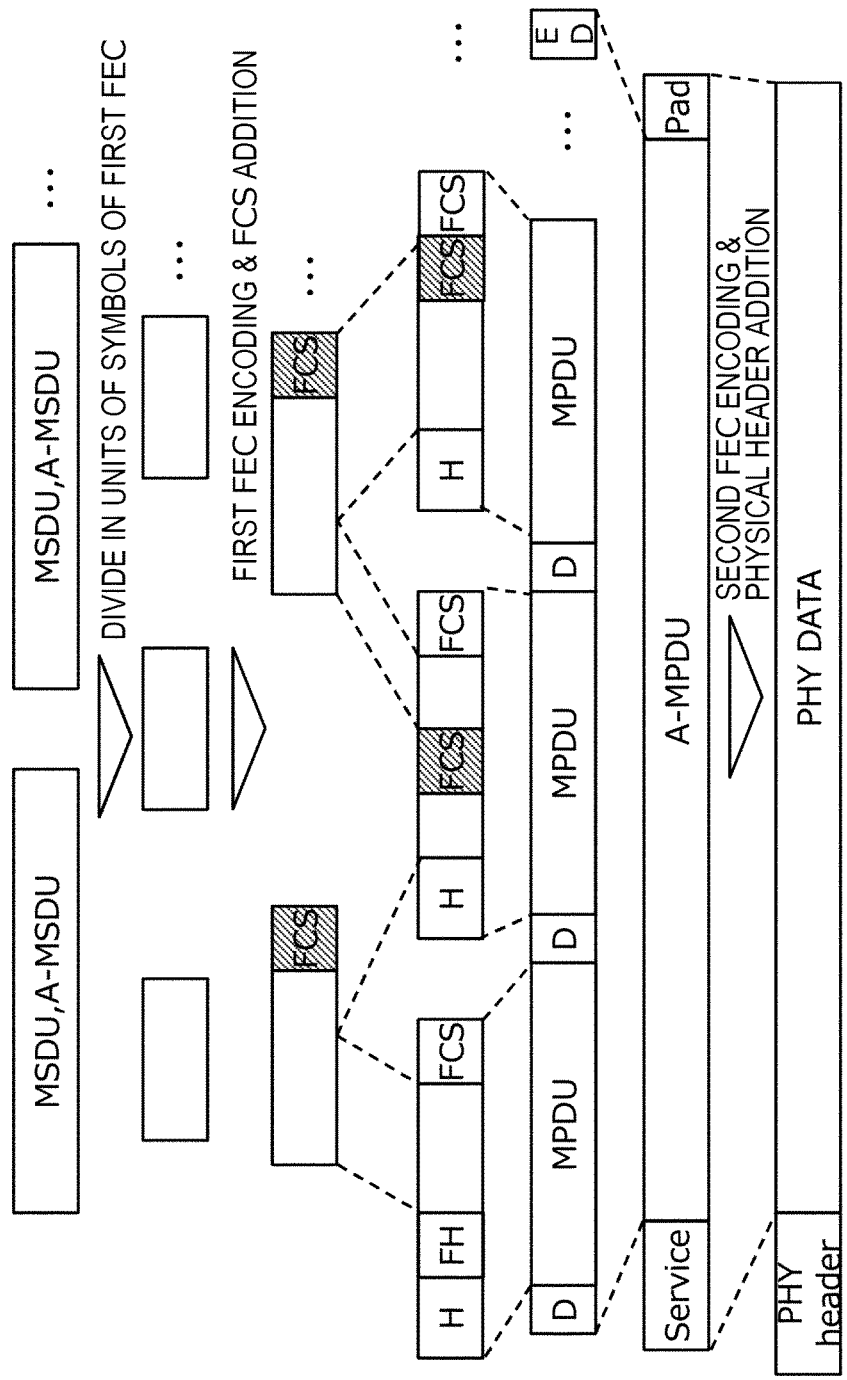
FIG. 23 is a diagram illustrating Example 2-7 of a procedure for generating a data frame of the IEEE 802.11 standard according to the present embodiment.

FIG. 23 illustrates Example 2-7 of a procedure for generating a data frame of the IEEE 802.11 standard according to the present embodiment. Example 2-7 adds a first FEC header only to a first encoded symbol at the head in Example 2-4 (see FIG. 20) described above. The rest is similar to Example 2-4.

Example 2-8

Figure 24:
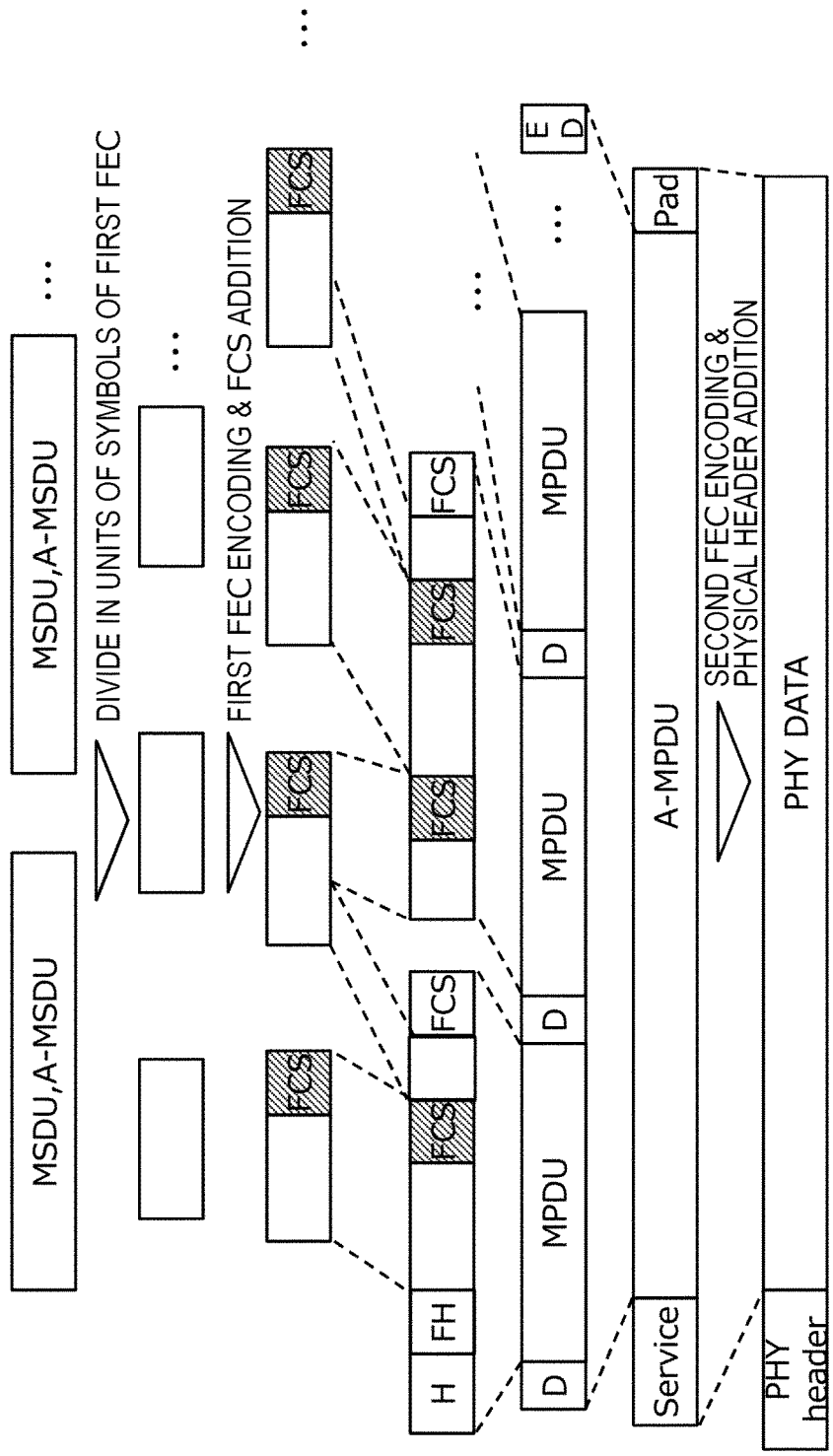
FIG. 24 is a diagram illustrating Example 2-8 of a procedure for generating a data frame of the IEEE 802.11 standard according to the present embodiment.

FIG. 24 illustrates Example 2-8 of a procedure for generating a data frame of the IEEE 802.11 standard according to the present embodiment. Example 2-8 adds a first FEC header only to a first encoded symbol at the head in Example 2-5 (see FIG. 21) described above. The rest is similar to Example 2-4.

In Examples 2-1 to 2-8 described above, the encoding of the first FEC is applied to the MSDUs or A-MSDU, but in the following, as Examples 2-9 to 2-12, a case where the encoding of the first FEC is applied directly to the MPDUs is illustrated. In this case, a first FEC header needs to be attached to at least one first encoded symbol. A field for ensuring backward compatibility may be included in a head portion of a first FEC header.

Example 2-9

Figure 25:
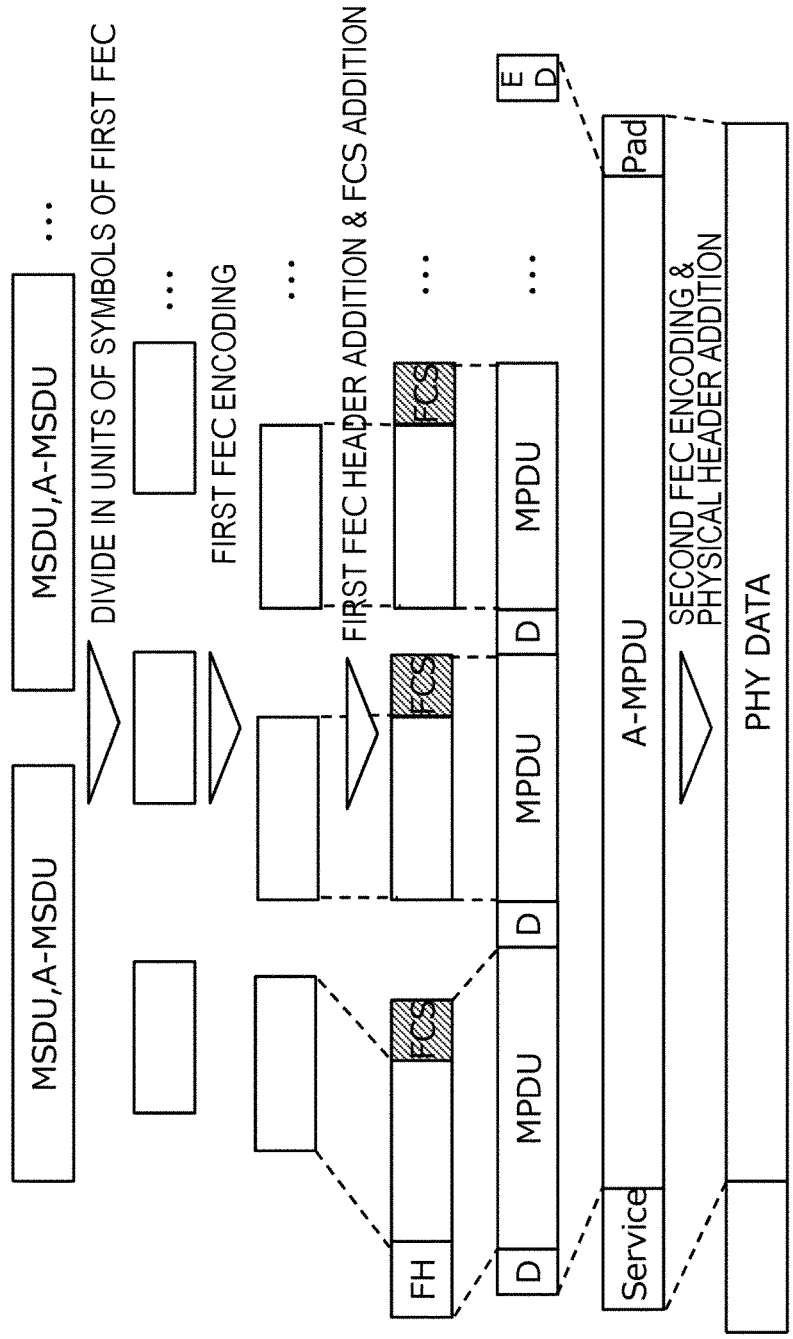
FIG. 25 is a diagram illustrating Example 2-9 of a procedure for generating a data frame of the IEEE 802.11 standard according to the present embodiment.

FIG. 25 illustrates Example 2-9 of a procedure for generating a data frame of the IEEE 802.11 standard according to the present embodiment. In Example 2-9, an FCS is added to the end of each symbol encoded by the first FEC to obtain a first encoded symbol.

A first FEC header is added to a first encoded symbol at the head. The first encoded symbol at the head to which the first FEC header and an FCS are added is set as an MPDU, and each of second and subsequent first encoded symbols is set as an MPDU. An MPDU header and an FCS are not added to each MPDU. The subsequent procedure is similar to Example 2-1 to Example 2-8 (see FIGS. 16 to 24). The information of the MPDU header may be stored in the first FEC header.

Example 2-10

Figure 26:
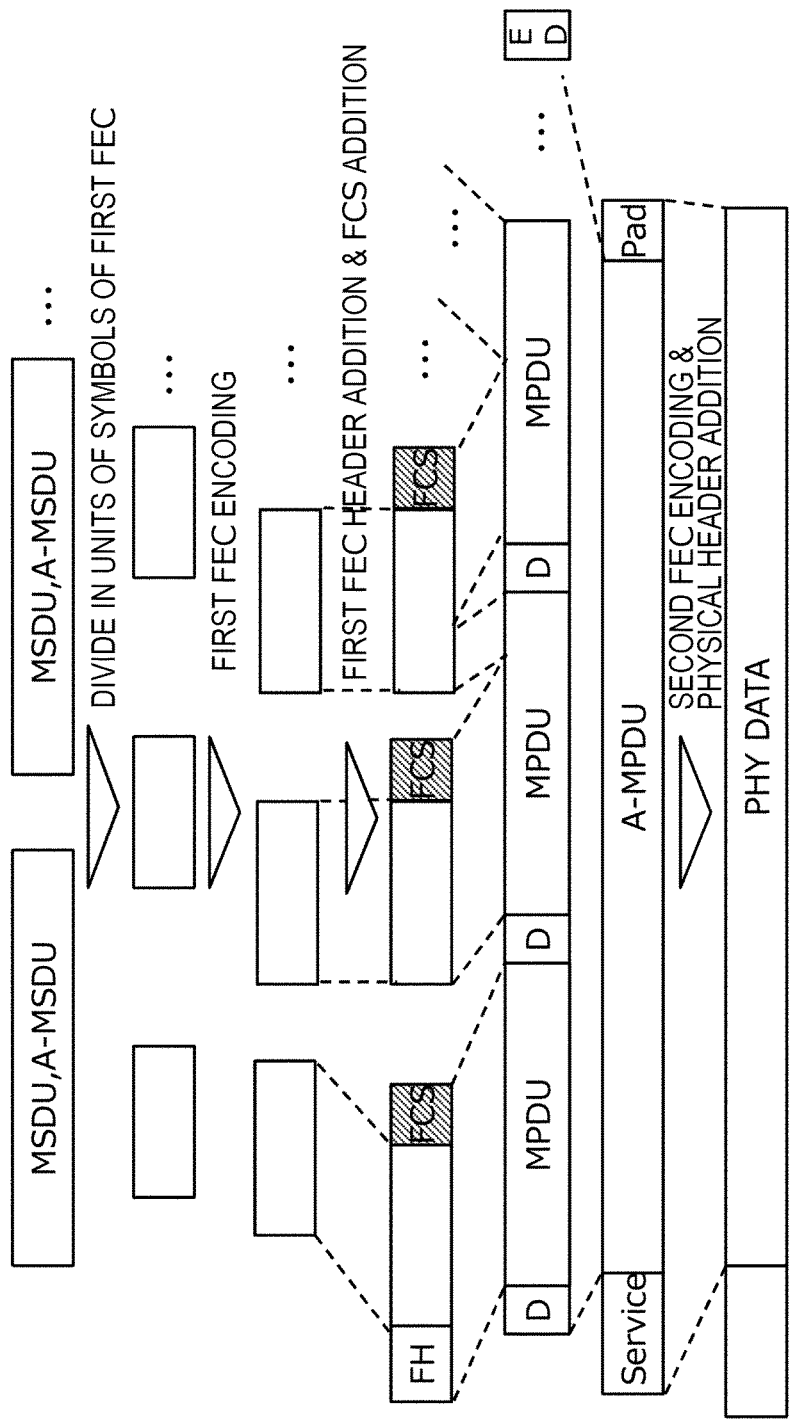
FIG. 26 is a diagram illustrating Example 2-10 of a procedure for generating a data frame of the IEEE 802.11 standard according to the present embodiment.

FIG. 26 illustrates Example 2-10 of a procedure for generating a data frame of the IEEE 802.11 standard according to the present embodiment. Example 2-10 adds a first FEC header only to a first encoded symbol at the head. In Example 2-10, for second and subsequent MPDUs, a first encoded symbol is concatenated with a part of a subsequent first encoded symbol to form an MPDU. The other procedures are similar to those in Example 2-9 (see FIG. 25).

Example 2-11

Figure 27:
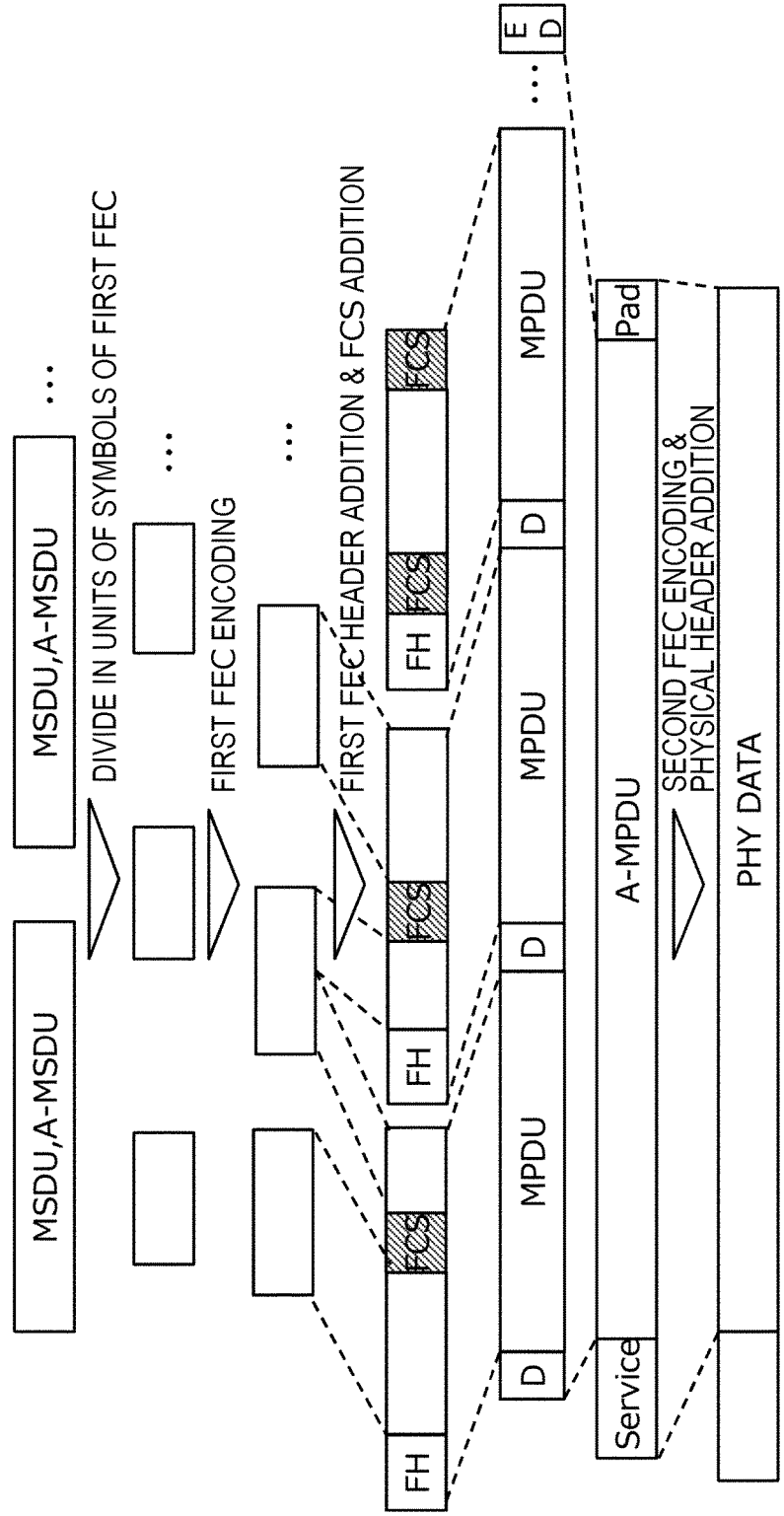
FIG. 27 is a diagram illustrating Example 2-11 of a procedure for generating a data frame of the IEEE 802.11 standard according to the present embodiment.

FIG. 27 illustrates Example 2-11 of a procedure for generating a data frame of the IEEE 802.11 standard according to the present embodiment. In Example 2-11, the first FEC header is added not only to a first encoded symbol at the head but also to other first encoded symbols. The other procedures are similar to those in Example 2-10 (see FIG. 26).

Example 2-12

Figure 28:
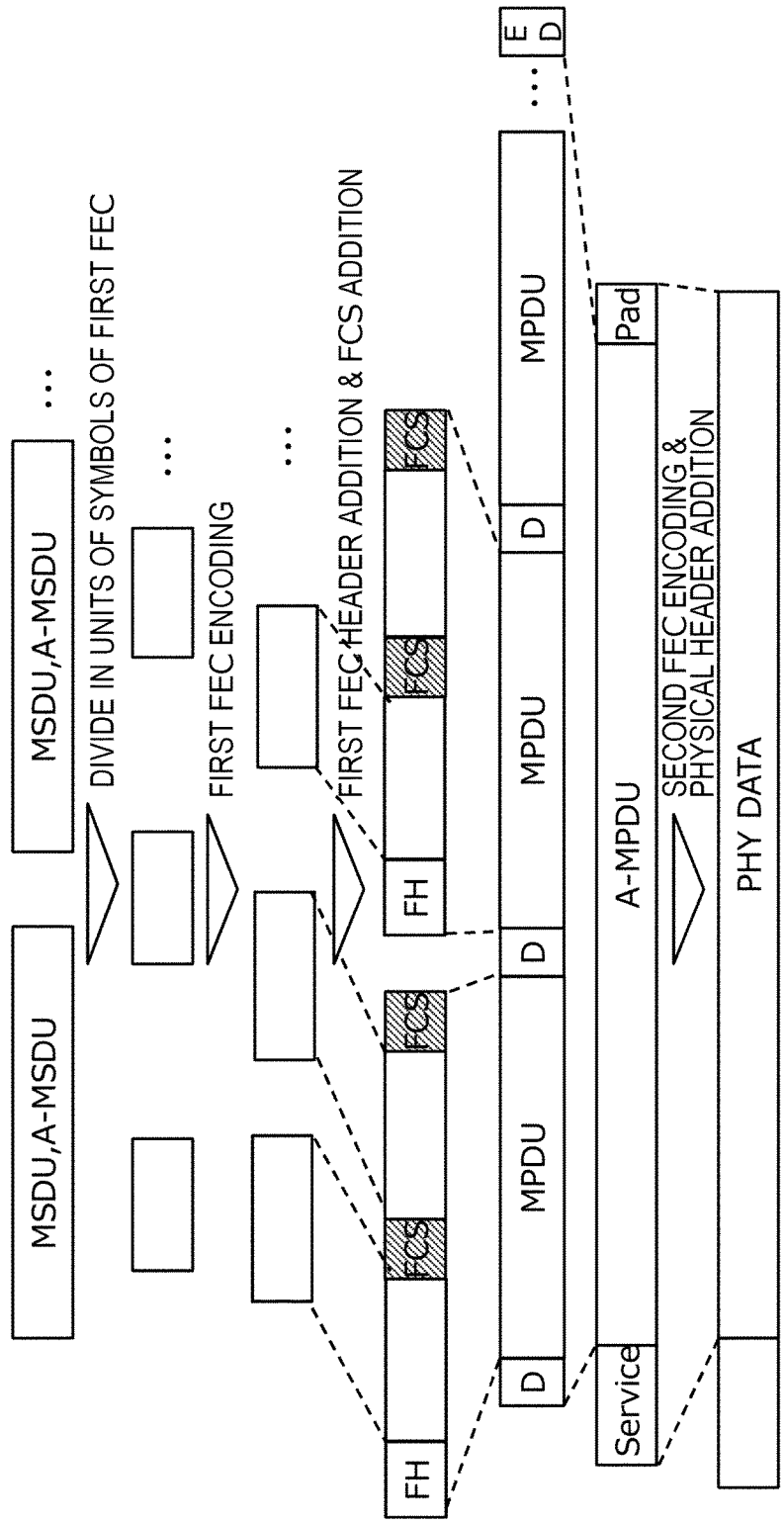
FIG. 28 is a diagram illustrating Example 2-12 of a procedure for generating a data frame of the IEEE 802.11 standard according to the present embodiment.

FIG. 28 illustrates Example 2-12 of a procedure for generating a data frame of the IEEE 802.11 standard according to the present embodiment. In Example 2-12, an MPDU is obtained by concatenating a plurality of first encoded symbols and adding a first FEC header. The MPDU includes a plurality of first encoded symbols. The other procedures are similar to those in Example 2-9 (see FIG. 25).

Figure 29:
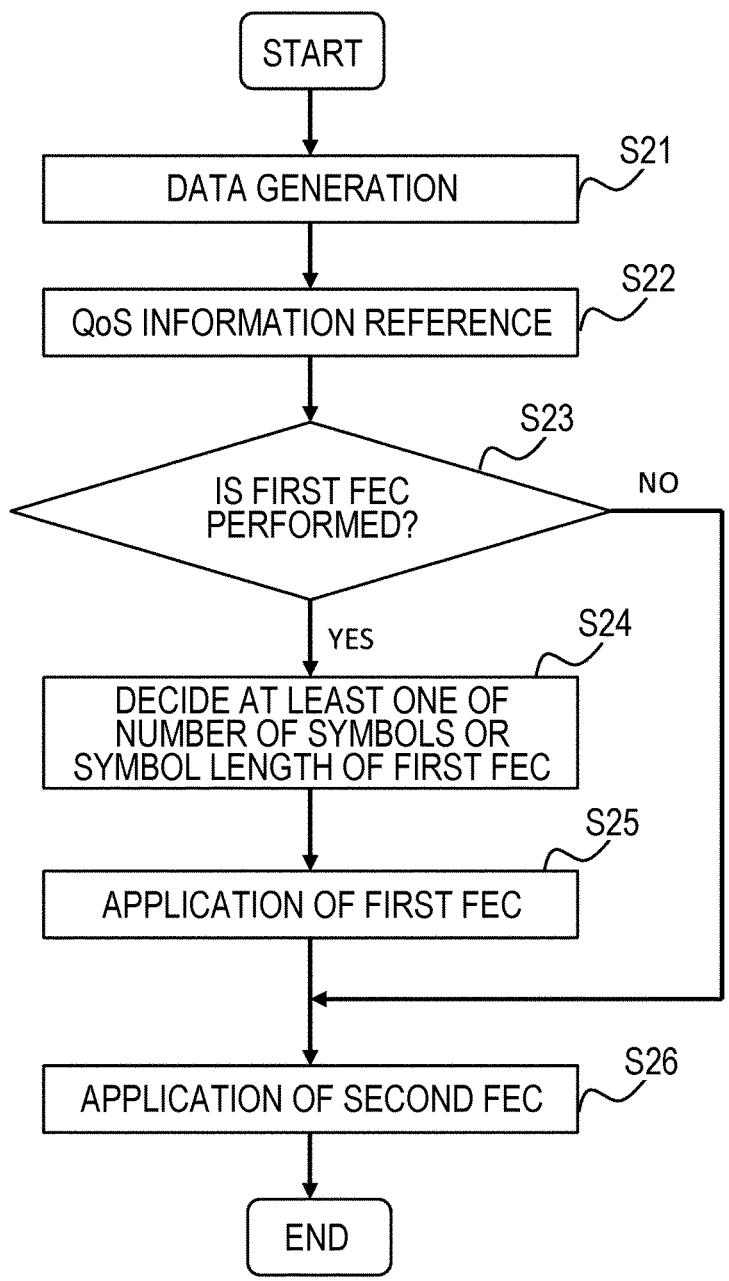
FIG. 29 is a flowchart illustrating an example of an operation performed by the transmission device according to the present embodiment.

FIG. 29 is a flowchart illustrating an example of an operation performed by the transmission device 100 according to the present embodiment. The higher layer processing unit 101 of the transmission device 100 generates data to be transmitted to the reception device 200 (S21). The first transmission processing unit 102 acquires the QoS information (S22), and judges whether or not to perform the first FEC (S23). The QoS information may be acquired from the higher layer processing unit 101 or may be acquired from the reception device 200. Alternatively, the first transmission processing unit 102 or the second transmission processing unit 104 may acquire the QoS information by measuring the communication quality with the reception device 200.

In a case of deciding not to perform the first FEC (NO in S23), the first transmission processing unit 102 performs the processing of the first protocol layer (data link layer or the like) on the data generated by the higher layer processing unit 101 without performing the encoding of the first FEC, and provides the processed data to the second transmission processing unit 104. The second transmission processing unit 104 generates a data frame by performing processing of the second protocol layer (physical layer or the like) including encoding of the second FEC on the data (S26).

In a case of deciding to perform the first FEC (YES in S23), the first transmission processing unit 102 decides at least one of the number of symbols or the symbol length of the first FEC (S24). On the basis of at least one of the decided number of symbols or symbol length, the data is divided in units of symbols of the first FEC, and processing including the above-described encoding of the first FEC is performed (S25). The first transmission processing unit 102 provides the processed data to the second transmission processing unit 104. The second transmission processing unit 104 generates a data frame by performing processing of the second protocol layer (physical layer or the like) including encoding of the second FEC on the data (S26).

As described above, according to the present embodiment, in a wireless network of the cellular mobile communication or a wireless LAN, FEC is performed in the protocol layer (Layer 2 of the 3GPP standard or the MAC layer of the IEEE 802.11 standard) higher than the physical layer, so that high reliability and low latency communication can be realized.

For example, encoding of the first FEC is performed with a symbol length according to the communication quality of the transmission path, the priority of the data, the type of the application, the coding rate of the second FEC, the coding rate of the first FEC, the modulation scheme, or the like. The reception side performs correct/incorrect determination for each symbol corresponding to the first FEC, and performs decoding of the first FEC using symbols whose determination results are OK. Retransmission is performed in units of symbols. Therefore, the number of retransmission requests to the transmission side can be reduced, and the amount of retransmission data can be reduced. That is, a case where the first FEC (erasure correction code) is simply applied to a layer higher than the physical layer (Layer 2 of the 3GPP standard or the MAC layer of the EEE 802.11 standard) in addition to the FEC of the physical layer (encoding using the second code) will be considered. In this case, the first FEC is applied in existing units of transport blocks, code blocks, or the like, and the effect of applying the first FEC may be limited. On the other hand, in the present embodiment, the number of retransmission requests and the amount of retransmission data can be reduced by performing the encoding of the first FEC with the appropriate symbol length described above. This enables higher reliability and lower latency communication.

(Hardware Configuration)

Figure 30:
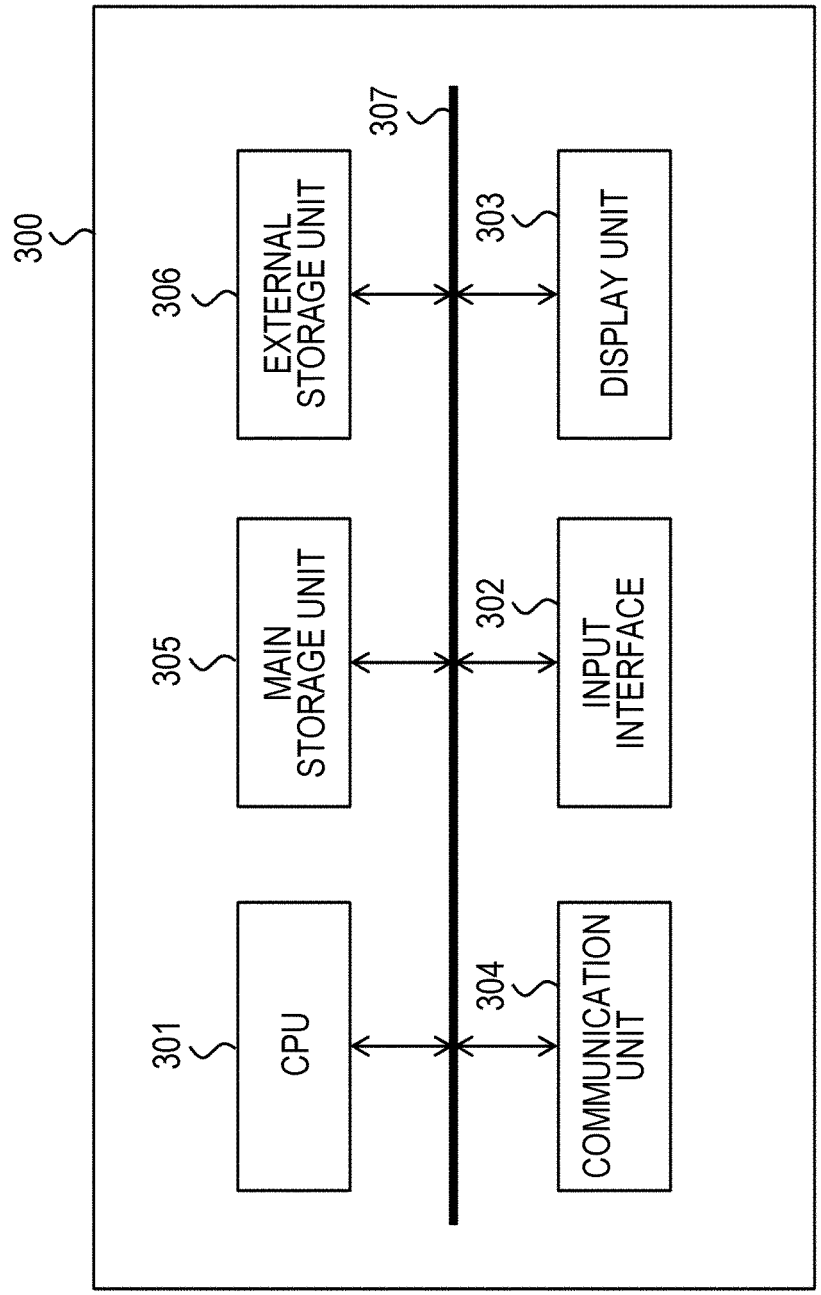
FIG. 30 is a diagram illustrating an example of a hardware configuration of the information processing device according to the present embodiment.

FIG. 30 illustrates an example of a hardware configuration of the information processing device according to the present embodiment. The information processing device includes a computer device 300. The information processing device corresponds to the transmission device 100 or the reception device 200. The computer device 300 includes a CPU 301, an input interface 302, a display unit 303, a communication unit 304, a main storage unit 305, and an external storage unit 306, which are connected to each other via a bus 307. A part of the configuration illustrated in FIG. 30 may not exist. For example, the display unit 303 or the input interface 302 may not exist. Furthermore, elements other than the configuration illustrated in FIG. 30 may exist. For example, there may be a battery that supplies power to each element, or a sensor device such as a camera, a microphone, or the like.

The CPU (central processing unit) 301 executes a computer program on the main storage unit 305. The computer program is a program that implements each of the above-described functional configurations of the information processing device. The computer program may be implemented not by one program but by a combination of a plurality of programs and scripts. The CPU 301 executes the computer program to implement each functional configuration.

The input interface 302 is a circuit for inputting an operation signal from an input device such as a keyboard, a mouse, a touch panel, and the like to the information processing device.

The display unit 303 displays data stored in the information processing device or data calculated by the information processing device. The display unit 303 is, for example, a liquid crystal display (LCD), an organic electroluminescence display, a cathode ray tube (CRT), or a plasma display (PDP), but is not limited thereto.

The communication unit 304 is a circuit for the information processing device to communicate with an external device in a wireless or wired manner. Data used in the information processing device can be input from an external device via the communication unit 304. The communication unit 304 includes an antenna. Data input from an external device can be stored in the main storage unit 305 or the external storage unit 306.

The main storage unit 305 stores a computer program, data necessary for execution of the computer program, data generated by execution of the computer program, and the like. The computer program is developed and executed on the main storage unit 305. The main storage unit 305 is, for example, RAM, DRAM, or SRAM, but is not limited thereto.

The external storage unit 306 stores a computer program, data necessary for execution of the computer program, data generated by execution of the computer program, and the like. The computer program and data are read into the main storage unit 305 when the computer program is executed. The external storage unit 306 is, for example, a hard disk, an optical disk, a flash memory, or a magnetic tape, but is not limited thereto.

Note that the computer program may be installed in the computer device 300 in advance or may be stored in a storage medium such as a CD-ROM or the like. Furthermore, the computer program may be uploaded on the Internet.

Furthermore, the computer device 300 may be configured as a single device, or may be configured as a system including a plurality of computer devices connected to each other.

Note that the above-described embodiments illustrate examples for embodying the present disclosure, and the present disclosure can be implemented in various other forms. For example, various modifications, substitutions, omissions, or combinations thereof can be made without departing from the gist of the present disclosure. Such modifications, substitutions, omissions, and the like are also included in the scope of the present disclosure and are included in the invention described in the claims and the equivalent scope thereof.

Furthermore, the effects of the present disclosure described in the present specification are merely examples, and other effects may be provided.

Note that the present disclosure can also have the following configurations.

[Item 1]
An information processing device including
a first processing unit that performs processing of a first protocol layer including processing of generating first coded data by encoding first data with an erasure correction code that is a first code, and provides the first coded data to a second protocol layer lower than the first protocol layer.

[Item 2]
The information processing device according to item 1,
in which the first processing unit generates the first coded data by adding error detection information to the first data encoded by the first code.

[Item 3]
The information processing device according to item 1 or 2, further including
a second processing unit that performs processing of the second protocol layer,
in which the second processing unit generates second coded data by encoding the first coded data with a second code, and generates data to be transmitted to a reception device on the basis of the second coded data.

[Item 4]
The information processing device according to item 3,
in which the second processing unit generates a code block in a 3GPP standard by encoding the first coded data with the second code.

[Item 5]
The information processing device according to item 3 or 4,
in which the first processing unit divides the first coded data into two or more fragments, and
the second processing unit generates a code block in a 3GP standard by encoding the fragments with the second code.

[Item 6]
The information processing device according to any one of items 3 to 5,
in which the first processing unit divides the first coded data into two or more fragments and concatenates a plurality of the fragments obtained from different pieces of the first coded data, and
the second processing unit generates a code block in a 3GP standard by encoding the fragments concatenated with the second code.

[Item 7]
The information processing device according to any one of items 3 to 6,
in which the first processing unit concatenates a plurality of pieces of the first coded data, and
the second processing unit generates a code block in a 3GPP standard by encoding a plurality of the first coded data concatenated by the second code.

[Item 8]
The information processing device according to any one of items 3 to 8,
in which the first processing unit divides the first coded data into a plurality of first fragments and divides the first fragments into a plurality of second fragments, and
the second processing unit generates a plurality of code blocks in a 3GPP standard by encoding the plurality of second fragments with the second code, and generates a transport block on the basis of the plurality of code blocks.

[Item 9]
The information processing device according to any one of items 3 to 8,
in which the first processing unit generates a MAC frame on the basis of the first coded data, and
the second processing unit encodes data including the MAC frame with the second code.

[Item 10]
The information processing device according to any one of items 3 to 9,
in which the first processing unit divides the first coded data into two or more fragments and generates a MAC frame including the fragments, and
the second processing unit encodes data including the MAC frame with the second code.

[Item 11]
The information processing device according to any one of items 3 to 10,
in which the first processing unit divides the first coded data into two or more fragments, concatenates a plurality of the fragments obtained from different pieces of the first coded data, and generates a MAC frame including a concatenation of the fragments, and
the second processing unit encodes data including the MAC frame with the second code.

[Item 12]
The information processing device according to any one of items 1 to 11,
in which the first processing unit decides at least one of a number of symbols or a symbol length to which encoding with the first code is applied on the basis of priority of transmission target data or information of an application of transmission target data, and
the first processing unit generates a plurality of pieces of the first data by dividing the transmission target data in units of symbols on the basis of at least one of the number of symbols or the symbol length.

[Item 13]
The information processing device according to any one of items 1 to 12,
in which the first processing unit decides at least one of a number of symbols or a symbol length to which encoding with the first code is applied on the basis of quality information of a communication path with a reception device, and
the first processing unit generates a plurality of pieces of the first data by dividing transmission target data in units of symbols on the basis of at least one of the number of symbols or the symbol length.

[Item 14]
The information processing device according to any one of items 1 to 13,
in which the first processing unit decides at least one of a number of symbols or a symbol length to which encoding with the first code is applied on the basis of at least one of a coding rate of encoding performed in the second protocol layer, a coding rate of encoding of the first data, or a modulation scheme used for transmission to a reception device, and
the first processing unit generates a plurality of pieces of the first data by dividing transmission target data in units of symbols on the basis of at least one of the number of symbols or the symbol length.

[Item 15]
The information processing device according to any one of items 1 to 14, in which the first processing unit decides whether or not to perform encoding with the first code on the basis of quality of service (QoS) information, and the first processing unit provides the first data to the second protocol layer in a case where encoding with the first code is not performed.

[Item 16]

The information processing device according to any one of items 1 to 15, in which the first processing unit notifies a reception device of information regarding encoding with the first code.

[Item 17]

The information processing device according to item 16, in which the first processing unit generates a first header including information regarding encoding with the first code, and the second protocol layer encodes data including the first header and the first coded data with a second code.

[Item 18]

The information processing device according to item 16 or 17, in which information regarding encoding with the first code includes at least one of:

a value indicating that encoding with the first code is being performed;

a type of the first code;

at least one of a number of symbols or a symbol length to which encoding with the first code is applied;

an index of a symbol to which encoding with the first code is applied; or at least one of a type or a length of error detection information included in the first coded data.

[Item 19]

The information processing device according to item 3, in which the second code is a convolutional code, a turbo code, an LDPC code, or a polar code.

[Item 20]

An encoding method including:

performing processing of a first protocol layer including processing of generating first coded data by encoding first data with an erasure correction code that is a first code; and providing the first coded data to a second protocol layer lower than the first protocol layer.

[Item 21]

An information processing device including:

a first processing unit that performs processing of a second protocol layer including processing of decoding data encoded by an erasure correction code that is a first code and further encoded by a second code by a decoding scheme corresponding to the second code; and a second processing unit that performs processing of a first protocol layer including processing of decoding decoded data by a decoding scheme corresponding to the first code.

[Item 22]

A decoding method including:

performing processing of a second protocol layer including processing of decoding data encoded by an erasure correction code that is a first code and further encoded by a second code by a decoding scheme corresponding to the second code; and performing processing of a first protocol layer including processing of decoding decoded data by a decoding scheme corresponding to the first code.

REFERENCE SIGNS LIST

11 Macro cell
12 Small cell
13 Macro cell base station
14 Small cell base station
15 Control entity
16 Core network
18 External network
19 HeNB gateway device
20 Gateway device
100 Transmission device
101 Higher layer processing unit
102 First transmission processing unit (first processing unit)
103 First FEC encoding unit
104 Second transmission processing unit (second processing unit)
105 Second FEC encoding unit
106 Communication unit
108 Antenna
200 Reception device
201 Higher layer processing unit
202 Second reception processing unit (second processing unit)
203 First FEC decoding unit
204 First reception processing unit (first processing unit)
205 Second FEC decoding unit
206 Communication unit
208 Antenna
300 Computer device
302 Input interface
303 Display unit
304 Communication unit
305 Main storage unit
306 External storage unit
307 Bus

The invention claimed is:

1. An information processing device comprising
a first processing circuit that performs processing of a first protocol layer, the processing of the first protocol layer including generating first coded data by encoding first data with an erasure correction code that is a first code, and provides the first coded data to a second protocol layer lower than the first protocol layer; and
a second processing circuit that performs processing of the second protocol layer,
wherein the processing of the second protocol layer includes:
generating second coded data by encoding the first coded data with a second code, and
generating data to be transmitted to a reception device based on the second coded data.

2. The information processing device according to claim 1,
wherein the first processing circuit generates the first coded data by adding error detection information to the first data encoded by the first code.

3. The information processing device according to claim 1, further comprising:
a transmitter that transmits the data to the reception device based on the second coded data.

4. The information processing device according to claim 1,
wherein the second processing circuit generates a code block in a 3GPP standard by encoding the first coded data with the second code.

5. The information processing device according to claim 1,
wherein the first processing circuit divides the first coded data into two or more fragments, and
the second processing circuit generates a code block in a 3GP standard by encoding the two or more fragments with the second code.

6. The information processing device according to claim 1,
wherein the first processing circuit divides the first coded data into two or more fragments and concatenates a plurality of the fragments obtained from different pieces of the first coded data, and
the second processing circuit generates a code block in a 3GP standard by encoding the two or more fragments concatenated with the second code.

7. The information processing device according to claim 1,
wherein the first processing circuit concatenates a plurality of pieces of the first coded data, and
the second processing circuit generates a code block in a 3GPP standard by encoding the plurality of pieces of the first coded data concatenated by the second code.

8. The information processing device according to claim 1,
wherein the first processing circuit divides the first coded data into a plurality of first fragments and divides the first fragments into a plurality of second fragments, and
the second processing circuit generates a plurality of code blocks in a 3GPP standard by encoding the plurality of second fragments with the second code, and generates a transport block based on the plurality of code blocks.

9. The information processing device according to claim 1,
wherein the first processing circuit generates a medium access control (MAC) frame based on the first coded data, and
the second processing circuit encodes data including the MAC frame with the second code.

10. The information processing device according to claim 1,
wherein the first processing circuit divides the first coded data into two or more fragments and generates a MAC frame including the two or more fragments, and
the second processing circuit encodes data including the MAC frame with the second code.

11. The information processing device according to claim 1,
wherein the first processing circuit divides the first coded data into two or more fragments, concatenates a plurality of the two or more fragments obtained from different pieces of the first coded data, and generates a MAC frame including a concatenation of the two or more fragments, and
the second processing circuit encodes data including the MAC frame with the second code.

12. The information processing device according to claim 1,
wherein the first processing circuit decides at least one of a number of symbols or a symbol length to which encoding with the first code is applied based on priority of transmission target data or information of an application of transmission target data, and
the first processing circuit generates a plurality of pieces of the first data by dividing the transmission target data in units of symbols based on at least one of the number of symbols or the symbol length.

13. The information processing device according to claim 1,
wherein the first processing circuit decides at least one of a number of symbols or a symbol length to which encoding with the first code is applied based on quality information of a communication path with a reception device, and
the first processing circuit generates a plurality of pieces of the first data by dividing transmission target data in units of symbols based on at least one of the number of symbols or the symbol length.

14. The information processing device according to claim 1,
wherein the first processing circuit decides at least one of a number of symbols or a symbol length to which encoding with the first code is applied based on at least one of a coding rate of encoding performed in the second protocol layer, a coding rate of encoding of the first data, or a modulation scheme used for transmission to a reception device, and
the first processing circuit generates a plurality of pieces of the first data by dividing transmission target data in units of symbols based on at least one of the number of symbols or the symbol length.

15. The information processing device according to claim 1,
wherein the first processing circuit decides whether or not to perform encoding with the first code based on quality of service (QOS) information, and
the first processing circuit provides the first data to the second protocol layer in a case where encoding with the first code is not performed.

16. The information processing device according to claim 1,
wherein the first processing circuit notifies a reception device of information regarding encoding with the first code.

17. The information processing device according to claim 16,
wherein the first processing circuit generates a first header including the information regarding encoding with the first code, and
the second protocol layer encodes data including the first header and the first coded data with a second code.

18. The information processing device according to claim 15,
wherein the information regarding encoding with the first code includes at least one of:
a value indicating that encoding with the first code is being performed;
a type of the first code;
at least one of a number of symbols or a symbol length to which encoding with the first code is applied;
an index of a symbol to which encoding with the first code is applied; or
at least one of a type or a length of error detection information included in the first coded data.

19. The information processing device according to claim 1,
wherein the second code is a convolutional code, a turbo code, a low density parity check (LDPC) code, or a polar code.

20. An encoding method comprising:
performing processing of a first protocol layer, the processing of the first protocol layer including generating first coded data by encoding first data with an erasure correction code that is a first code;

providing the first coded data to a second protocol layer lower than the first protocol layer;
performing processing of the second protocol layer, the processing of the second protocol layer including:
  generating second coded data by encoding the first coded data with a second code, and
  generating data to be transmitted to a reception device based on the second coded data.

21. An information processing device comprising:
a first processing circuit that performs processing of a first protocol layer, the processing of the first protocol layer including decoding data that is encoded by an erasure correction code that is a first code and that is further encoded by a second code by a decoding scheme corresponding to the second code; and
a second processing circuit that performs processing of a second protocol layer, the processing of the second protocol layer including decoding decoded data by a decoding scheme corresponding to the first code.

22. A decoding method comprising:
performing processing of a first protocol layer, the processing of a first protocol layer including decoding data that is encoded by an erasure correction code that is a first code and that is further encoded by a second code by a decoding scheme corresponding to the second code; and
performing processing of a second protocol layer, the processing of the second protocol layer including decoding decoded data by a decoding scheme corresponding to the first code.

\* \* \* \* \*